US007046361B1

(12) United States Patent
Yang et al.

(10) Patent No.: US 7,046,361 B1
(45) Date of Patent: *May 16, 2006

(54) POSITIONING TWO ELEMENTS USING AN ALIGNMENT TARGET WITH A DESIGNED OFFSET

(75) Inventors: Weidong Yang, Milpitas, CA (US); Roger R. Lowe-Webb, Sunnyvale, CA (US); John D. Heaton, Fremont, CA (US)

(73) Assignee: Nanometrics Incorporated, Milpitas, CA (US)

( * ) Notice: Subject to any disclaimer, the term of this patent is extended or adjusted under 35 U.S.C. 154(b) by 399 days.

This patent is subject to a terminal disclaimer.

(21) Appl. No.: 10/116,964

(22) Filed: Apr. 4, 2002

(51) Int. Cl.
*G01B 11/00* (2006.01)

(52) U.S. Cl. .................................... 356/401
(58) Field of Classification Search ........ 356/399–401; 355/53, 55; 250/548; 430/5, 22, 30
See application file for complete search history.

(56) References Cited

U.S. PATENT DOCUMENTS

| | | | | |
|---|---|---|---|---|
| 3,867,038 A | * | 2/1975 | Westell | 356/400 |
| 4,656,347 A | | 4/1987 | Une et al. | 250/548 |
| 4,699,505 A | * | 10/1987 | Komoriya et al. | 355/30 |
| 4,778,275 A | * | 10/1988 | van den Brink et al. | 356/401 |
| 5,214,492 A | | 5/1993 | LoBianco et al. | 356/400 |
| 5,216,257 A | | 6/1993 | Brueck et al. | 250/548 |
| 5,307,152 A | | 4/1994 | Boehnlein et al. | 356/376 |
| 5,355,219 A | | 10/1994 | Araki et al. | 356/490 |
| 5,521,036 A | * | 5/1996 | Iwamoto et al. | 430/22 |
| 5,559,598 A | | 9/1996 | Matsumoto | 356/490 |
| 5,559,601 A | * | 9/1996 | Gallatin et al. | 356/490 |
| 5,596,413 A | | 1/1997 | Stanton et al. | 356/401 |
| 5,805,290 A | | 9/1998 | Ausschnitt et al. | 356/401 |
| 5,808,742 A | * | 9/1998 | Everett et al. | 356/509 |
| 5,969,819 A | | 10/1999 | Wang | 356/371 |
| 6,077,756 A | | 6/2000 | Lin et al. | 438/401 |
| 6,079,256 A | | 6/2000 | Bareket | 73/105 |

(Continued)

FOREIGN PATENT DOCUMENTS

WO  WO 01/84382 A1  11/2001

(Continued)

OTHER PUBLICATIONS

D.C. Flanders & Henry I. Smith, "A new interferometric alignment technique", Applied Physics Letters, vol. 31, No. 7, Oct. 1, 1977, pp. 426-428.

(Continued)

*Primary Examiner*—Gregory J. Toatley, Jr.
*Assistant Examiner*—Gordon J. Stock, Jr.
(74) *Attorney, Agent, or Firm*—Silicon Valley Patent Group, LLP

(57) ABSTRACT

An alignment system for aligning two elements includes an alignment target with periodic patterns on each element. The alignment target includes two locations, at least one of which has a designed in offset. If desired, both locations may have designed in offsets of the same magnitude but in opposite directions. The diffraction patterns produced at the two locations are compared. If the difference between the patterns is at a minimum, the elements are properly aligned. When an alignment error is introduced, however, the calculated difference can be used to determine the error. In another embodiment, bands in the moiré fringes from the different locations may be compared to determine the alignment error. The two elements may then be moved relative to each other to minimize the alignment error. Thus, the alignment target may advantageously be used in any alignment system, such as an exposure tool.

25 Claims, 20 Drawing Sheets

U.S. PATENT DOCUMENTS

| | | | |
|---|---|---|---|
| 6,084,712 A | 7/2000 | Harding | 359/618 |
| 6,130,750 A | 10/2000 | Ausschnitt et al. | 356/401 |
| 6,407,396 B1 | 6/2002 | Mih et al. | 250/491.1 |
| 6,429,930 B1 | 8/2002 | Littau et al. | 356/124 |
| 6,458,605 B1 | 10/2002 | Stirton | 438/7 |
| 6,710,876 B1 | 3/2004 | Nikoonahad et al. | 356/401 |
| 6,999,624 B1 | 3/2004 | Niu et al. | 430/5 |
| 6,804,005 B1 | 10/2004 | Bischoff et al. | 356/369 |
| 2002/0135875 A1 | 9/2002 | Niu et al. | 359/564 |
| 2002/0158193 A1 | 10/2002 | Sezginer et al. | 250/237 |
| 2003/0002043 A1 | 1/2003 | Abdulhalim et al. | 356/400 |
| 2003/0042579 A1 | 3/2003 | Schulz | 257/629 |
| 2003/0043372 A1 | 3/2003 | Schulz | 356/327 |
| 2003/0043375 A1 | 3/2003 | Opsal | 356/369 |
| 2003/0044702 A1 | 3/2003 | Schulz | 430/30 |
| 2003/0160163 A1 | 8/2003 | Wong et al. | 250/237 |
| 2003/0169423 A1 | 9/2003 | Finarov et al. | 250/237 |
| 2003/0223630 A1 | 12/2003 | Adel et al. | 382/145 |
| 2004/0101983 A1 | 5/2004 | Jones et al. | 438/14 |

FOREIGN PATENT DOCUMENTS

| | | |
|---|---|---|
| WO | WO 02/25723 A2 | 3/2002 |
| WO | WO 02/065545 A2 | 8/2002 |
| WO | WO 02/069390 A2 | 9/2002 |
| WO | WO 02/084213 A1 | 10/2002 |
| WO | WO 03/071471 A1 | 8/2003 |
| WO | WO 2004/008068 A1 | 1/2004 |

OTHER PUBLICATIONS

Bischoff, J. et al., "Light Diffraction Based Overlay Measurement" *Proceedings of SPIE*, vol. 4344 (2001) pp. 222-233.

Michaelis, A. et al., "Spectroscopic Anistropy Micro-Ellipsometry (SAME) for determiation of lateral and vertical dimensions of sub-micron lithographic structures" IEEE Catalog No. 99TH8453 (1999) pp. 131-134.

NanoWave:Technology/development tools, http://www.nanowave.com/technology_applications/tech_devtoolsPR.html, 2 pages, downloaded Apr. 9, 2002.

NanoWave:Technology/how it works, http://www.nanowave.com/technology_applications/tech_HIWPR.html, 3 pages, downloaded Apr. 9, 2002.

NanoWave:Technology/product design, http://www.nanowave.com/technology_applications/tech_designPR.html, 4 pages, downloaded Apr. 9, 2002.

* cited by examiner

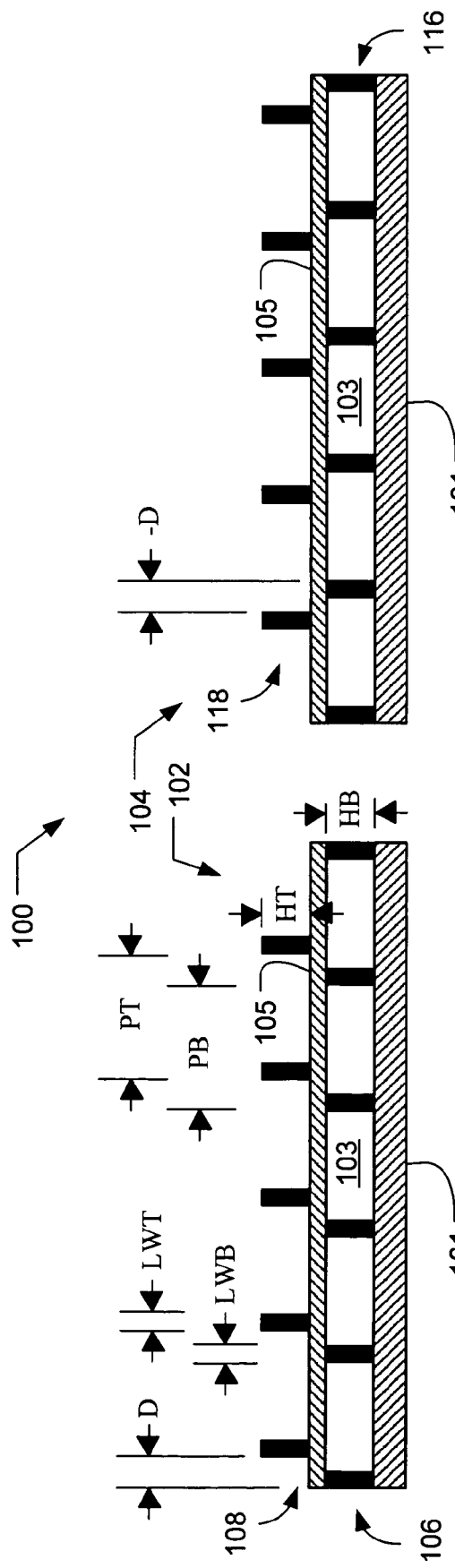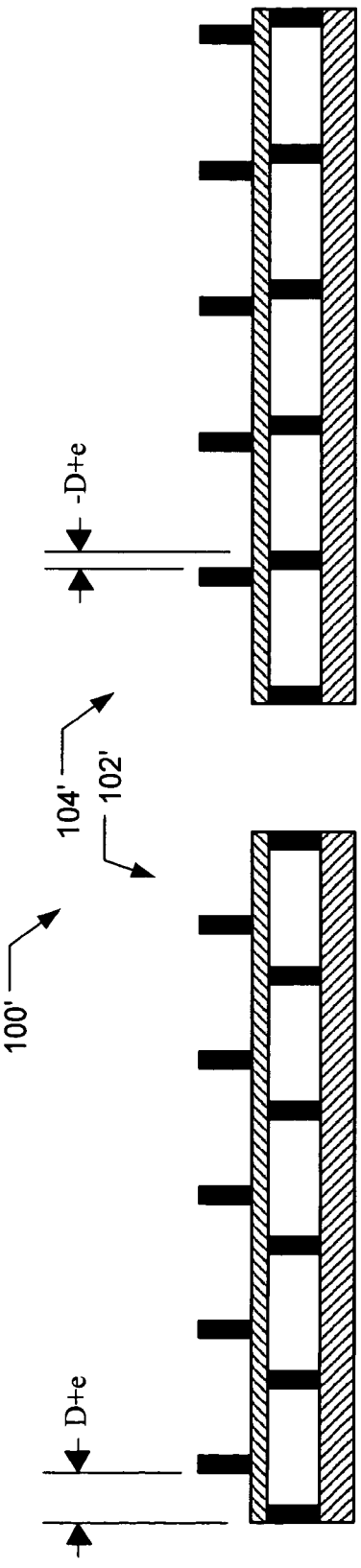
Fig. 2
Fig. 3

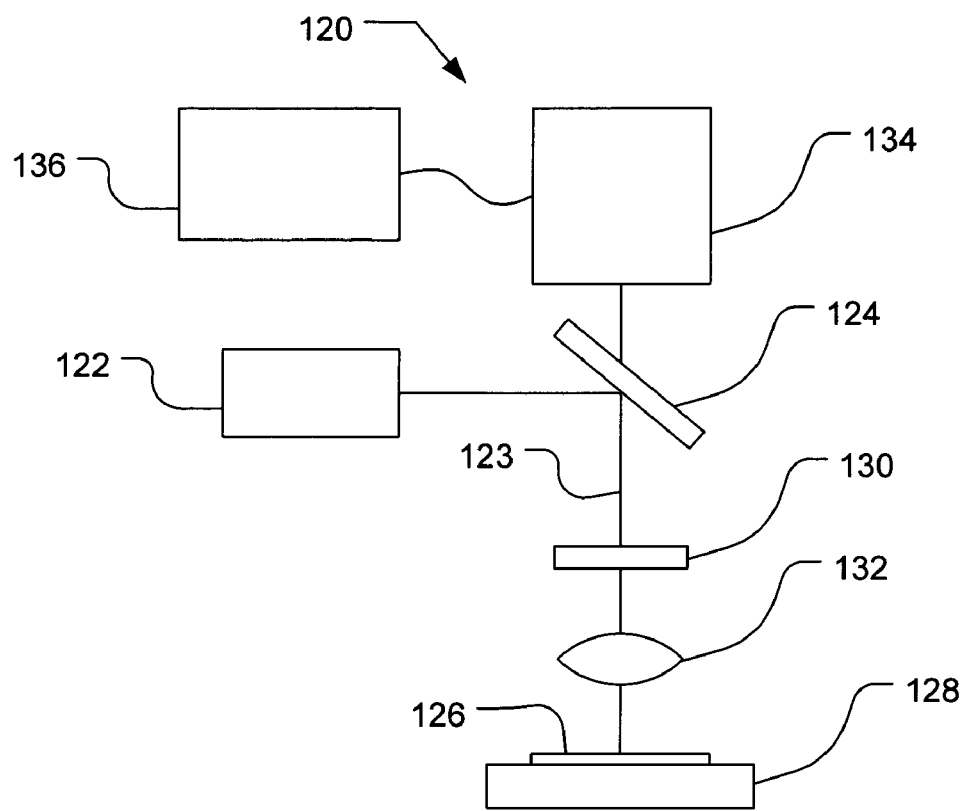
Fig. 12A
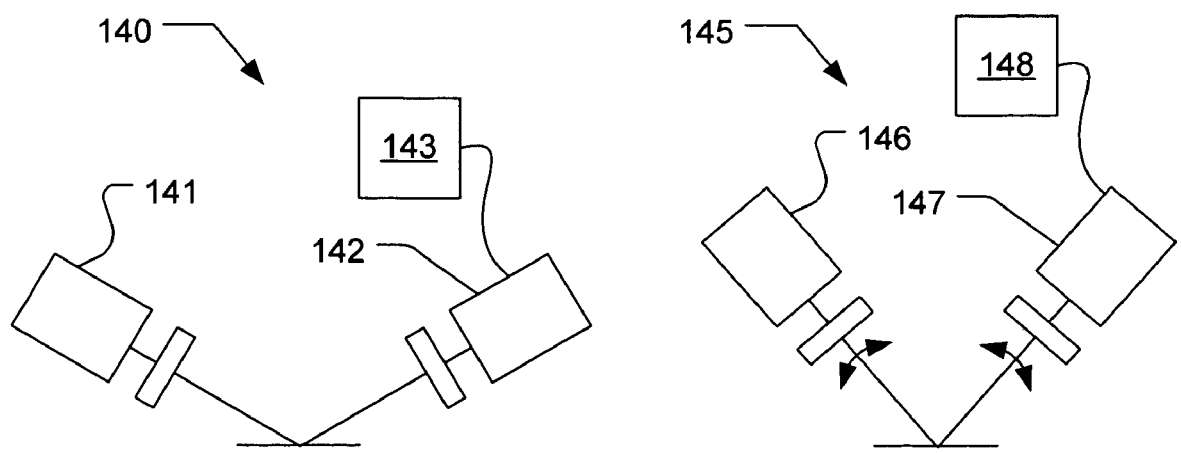
Fig. 12B                    Fig. 12C

POSITIONING TWO ELEMENTS USING AN ALIGNMENT TARGET WITH A DESIGNED OFFSET

BACKGROUND OF THE INVENTION

1. Field of the Invention

The present invention relates to alignment control, and in particular to an alignment system that uses an alignment target that includes at two locations having designed in offsets.

2. Discussion of the Related Art

Semiconductor processing for forming integrated circuits requires a series of processing steps. These processing steps include the deposition and patterning of material layers such as insulating layers, polysilicon layers, and metal layers. The material layers are typically patterned using a photoresist layer that is patterned over the material layer using a photomask or reticle. As the integrated circuit feature sizes continue to decrease to provide increasing circuit density, it becomes increasingly difficult to align one layer with another.

During processing, the substrate is moved from one location to the next so that different areas, e.g., dies, on the substrate can be exposed. The alignment system, e.g., the exposure tool, typically uses an alignment target to properly align the substrate during exposure. FIG. 1 shows a conventional alignment system 50, which includes a diffraction grating 52 on the substrate and a second diffraction grating 54 that is stationary, e.g., is fixed to the lens on the exposure tool. A light source 56 produces coherent light that passes through a beam splitter 58 and is incident on the diffraction grating 52 after passing through a lens 60. The light is diffracted by diffraction grating 52 and passes through lens 60 back to beam splitter 58. The coherent light beam from source 56 is also reflected off beam splitter 58, passes through lens 62 and is incident on diffraction grating 54. The light diffracted by diffraction grating 54 passes back through lens 62 to beam splitter 58. At beam splitter 58 the light diffracted from diffraction gratings 52 and 54 is combined and the combined diffraction patterns is received by light detectors 64.

Alignment system 50 provides an accuracy of approximately 15 nm. One disadvantage of alignment system 50 is that coherent light is used. Thus, if the diffraction grating 52 on the sample absorbs the particular frequency used, alignment system 50 cannot provide an accurate measurement. While multiple coherent light sources may be used to avoid this disadvantage, the use of multiple light sources adds complexity and cost.

Thus, there is a need in the semiconductor industry for an improved alignment system.

SUMMARY

In accordance with the present invention, an alignment system is used for aligning two elements, such as a substrate and/or a reticle with a reference mask, two stages, or any two items in general. The alignment system includes an alignment target that has at least one periodic pattern, e.g., diffraction gratings, on each of the two elements to be aligned. The alignment target includes at least two locations with at least one having a designed in offsets between the periodic patterns on each of the elements. If desired, the alignment target may have a designed in offset at each measurement location of the same magnitude but in opposite directions. Alternatively, the locations may have a designed in offset of different magnitudes or in non-parallel directions. For example, the two locations on the alignment target may be two separate overlay patterns, e.g., sets of periodic patterns, that are mirror images of each other. A single set of periodic patterns may be used, with one periodic pattern on one element and another periodic pattern on the other element. The periodic patterns may have different pitches. In such an embodiment, the length of the pattern is sufficient to allow two locations that have a designed in offset of the same magnitude but opposite direction.

To determine the alignment error, radiation is incident on and reacts with the two locations in the alignment target. The radiation is then detected and compared, e.g., the difference between the radiation may be calculated. Advantageously, the calculated difference is extremely sensitive to any alignment error. When the difference between the patterns is at a minimum, the elements are properly aligned. If the elements are not aligned, the difference will be increased. A slight alignment error will produce a relatively large, and easily detected, calculated difference. By moving the elements into alignment the difference will converge on approximately zero. The alignment target may be used, e.g., on an exposure tool to pre-align with a substrate prior to exposure or any other system in which precise alignment between two elements is desirable.

It should be understood that the designed in offset is an intended offset between the periodic pattern on one element relative to the periodic pattern on the other element. In practice, when the two elements are not in alignment, the offset between the periodic patterns on the two elements will not be the designed in offset, but will be the combination of the designed in offset and the overlay error.

In one embodiment of the present invention, a method of positioning a first element with respect to a second element includes providing an alignment target on the first element and the second element, the alignment target having at least one periodic pattern on the first element and at least one periodic pattern on the second element, the alignment target having at least two locations, at least one of which has a designed in offset between the periodic pattern on the first element and the periodic pattern on the second element. In one embodiment, both locations have a designed in offset of the same magnitude but in opposite directions. In another embodiment, the designed in offsets may be different magnitudes or in different directions. The method includes illuminating the at least two locations on the alignment target with incident radiation and detecting the radiation after it interacts with the alignment target. The detected radiation from each location is then compared to determine the alignment of said first element with respect to said second element. The method includes moving one element with respect to the other. The movement of the elements may be in response to the comparison, i.e., to minimize the alignment error.

The first element may be a substrate and the second element may be a reference mask. The method may then include moving at least one of the substrate and the reticle to minimize the alignment error based on the comparison between the measured light diffracted by the at least two locations.

The method may include receiving the radiation by a two dimensional detector that receives the spectra dispersed along one dimension and the spectra associated with different overlay patterns separated along a direction perpendicular to the spectral dispersion.

The detected radiation may be diffracted light or may be an image of the different locations of the alignment target in the form of moiré fringes. The bands of the moiré fringes can then be detected and compared to determine alignment of the two elements.

In accordance with another embodiment, a method of aligning two elements includes determining whether a first element is aligned with a second element using at least two locations of an alignment target. The alignment target has at least one periodic pattern on the first element and at least one periodic pattern on the second element, where at least one of the two locations has designed in offset between the periodic pattern on the first element and the periodic pattern on the second element. The method includes moving the first element relative to the second element.

Another embodiment of the present invention is an apparatus for positioning a first element with a second element. The apparatus includes an alignment target having at least one periodic pattern on the first element and at least one periodic pattern on the second element, the alignment target including at least two locations, at least one of which has a designed in offset between the periodic patterns. If both locations have a designed in offset the offsets may be of the same magnitude in opposite directions. The apparatus includes a light source for producing light to be incident on the at least two locations of the alignment target and a light detector for detecting light after reacting with the two locations of the alignment target. The apparatus further includes a processor with a computer-usable medium having computer-readable program code embodied therein for causing the processor to calculate the difference between the detected light from the two locations and using the difference to determine if the first element and the second element are aligned. The apparatus includes a stage that is controlled by the processor and that moves one of the elements with respect to the other element to minimize the alignment error.

BRIEF DESCRIPTION OF THE DRAWINGS

FIG. 2 shows a cross-sectional view of an alignment target, in accordance with an embodiment of the present invention.

FIG. 3 shows a cross-sectional view of an alignment target, in accordance with an embodiment of the present invention with an introduced alignment error.

FIGS. 12A, 12B, 12C show metrology devices that may be used to measure the diffraction from an alignment target in accordance with the present invention.

FIG. 16 shows substrate and reticle with lens disposed between.

DETAILED DESCRIPTION

Figure 1:
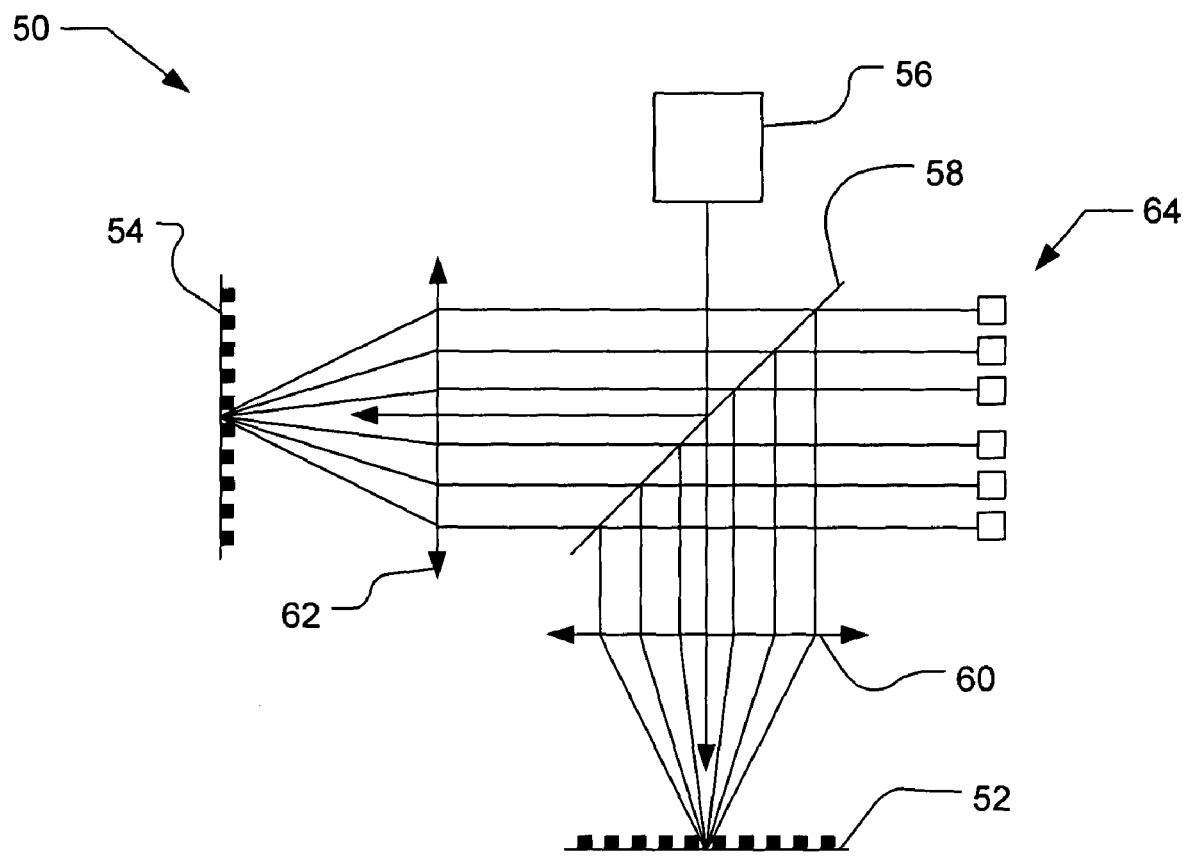
FIG. 1 shows a conventional alignment system.

In accordance with an embodiment of the present invention, an alignment system aligns two elements using an alignment target that includes at least one periodic pattern on one element that is aligned relative to another periodic pattern on the other element. The alignment target includes at least two locations, i.e., areas of the alignment target, at least one of which has a designed in offset between the periodic patterns. For example, both locations can have a designed in offset that is equal in magnitude but opposite in direction. Alternatively, the magnitudes may differ and/or the directions may be non-parallel. The alignment target may be used to determine the alignment error between any two elements, e.g., between the lens and the substrate and/or reticle in an exposure tool, any two stages, or any other items to be aligned. Advantageously, the alignment target of the present invention is relatively insensitive to unintentional rotation of the top element with respect to the bottom element.

The alignment system uses incident light that interacts at the two locations of the alignment target, e.g., is diffracted or creates moiré fringe patterns. The difference in the light that interacts with the alignment target at the two locations is extremely sensitive to alignment error. Thus, for example, if the alignment error is approximately zero, the difference will be a minimum, e.g., approximately zero plus noise. If, however, a slight alignment error is present, the difference will be relatively large. The presence of a small alignment error may be easily and accurately determined, which is advantageous in an exposure tool or any other device in which an accurate alignment between two elements is desired.

To determine the presence of an alignment error, the difference in the light that interacts with the alignment target at the two locations, e.g., the spectra from the two locations, is calculated. When the difference is at a minimum, ideally zero, the alignment error is minimized. If the difference is non-zero, one element may be moved relative to the other element and the difference recalculated. The difference will converge on approximately zero as the elements are moved into alignment.

Alternatively, an image of the resulting moiré fringe patterns produced by the gratings may be used. The bands of the moiré fringes from one location are detected and compared to the bands of the moiré fringes from the other location. When the bands of the moiré fringes are in the same relative positions the alignment error is minimized.

The present invention may be used to control the alignment error down to a fraction of a nanometer, while the current industry standard is approximately 15 nm. Thus, the present invention provides a large improvement compared to current technology.

Alignment target is used generally to mean a target that aids in the alignment process, e.g., in an exposure tool, as well as an overlay target, which is used to measure the overlay error on a substrate. It should be understood that the use of the alignment target of the present invention is not limited to aligning two elements in an alignment process, but may be used to measure an overlay error on a device, such as an overlay error between two layers on a substrate. The use of the alignment target to measure an overlay error is described in more detail in U.S. patent application entitled "Alignment Target with Designed in Offset" by Weidong Yang, Roger R. Lowe-Webb, John D. Heaton, and Guoguang Li, Ser. No. 10/116,863, and in U.S. patent application entitled "Measuring An Alignment Target With Multiple Polarization States" by Weidong Yang, Roger R. Lowe-Webb, Ser. No. 10/116,798; and in U.S. patent application entitled "Encoder with Alignment Target", by John D. Heaton, Weidong Yang, and Roger R. Lowe-Webb, Ser. No. 10/116,855, all of which are filed herewith and have the same assignee as the present application and are incorporated herein by reference.

To assist in the description of an alignment system using the alignment target, it is helpful to first describe the alignment target.

FIG. 2 shows a cross-sectional view of an alignment target 100 in accordance with an embodiment of the present invention in which there are two locations with a designed in offset of the same magnitude but different directions. The two locations in alignment target 100 are referred to as overlay patterns 102 and 104, respectively. Each of the overlay patterns 102, 104 includes a bottom periodic pattern, referred to as diffraction gratings 106, 116, and a top periodic pattern, referred to as diffraction gratings 108, 118. Alignment target 100 is described as being produced on different layers on a substrate. It should be understood, however, that the alignment target 100 may also be used in an alignment system, in which case, the top and bottom diffraction gratings are movable relative to each other, as will be discussed in more detail in reference to FIG. 15.

Each overlay pattern 102, 104 is similar to the overlay pattern described in the U.S. Ser. No. 09/960,892 entitled "Spectroscopically Measured Overlay Target", filed Sep. 20, 2001, which has the same assignee as the present disclosure and which is incorporated herein in its entirety by reference. However, only one overlay target is described in U.S. Ser. No. 09/960,892, whereas two mirror imaged overlay patterns 102, 104 are used as the alignment target in accordance with the present invention. While it is possible to determine the overlay error by measuring the reflectance spectrum of one grating target and modeling the spectrum using, e.g., RCWA, as described in U.S. Ser. No. 09/960,892, the accuracy suffers from systematic errors such as imperfections in the model. The effect of systematic error on the absolute accuracy can be expressed as $\text{shift}_{mesasured} = \text{shift}_{real} + \text{error}_{systematic}$. The present invention, advantageously, increases the accuracy by canceling out the systematic error term.

The overlay patterns 102, 104 are produced on a substrate 101, which is e.g., a silicon substrate. The substrate may be a semiconductor wafer, flat panel display or any other structure in which accurate alignment of successive layers is important. Of course, there may be layers between substrate 101 and the bottom diffraction gratings 106, 116. It should be understood that while FIG. 2 shows overlay patterns 102 and 104 as separate patterns, overlay patterns 102 and 104 are included on the same substrate, preferably near to each other and together form alignment target 100.

The bottom diffraction gratings 106, 116 are produced, for example, by providing a layer of appropriate material, such as a 200 nm layer of polysilicon, followed by a layer of photoresist. The desired image including the diffraction gratings 106, 116 is exposed in the photoresist, which is then developed. The polysilicon is then etched away leaving diffraction gratings 106, 116. A layer 103, such as a dielectric layer, is then deposited over diffraction gratings 106, 116.

As shown in FIG. 2, an overlaying layer 105, which may be, e.g., a 1000 nm layer of silicon oxide, is deposited over the bottom diffraction gratings 106, 116. The top diffraction gratings 108, 118 are then produced using, e.g., photoresist, in a manner similar to the bottom diffraction grating 102, where the top diffraction gratings 108, 118 are separated from the bottom diffraction gratings 106, 116 by the thickness of layer 105, e.g., 1000 nm. For example, an 800 nm layer of the photoresist is deposited over layer 105. The desired image including the diffraction gratings 108, 118 is exposed in the photoresist layer. The photoresist is then developed, thereby leaving diffraction gratings 108, 118.

It should be understood that the processing steps used to produce overlay patterns 102 and 104 are exemplary. Different or additional layers may be included between the substrate 101 and the bottom diffraction gratings 106, 116 or between the bottom diffraction gratings 106, 116 and the top diffraction gratings 108, 118. Additionally, fewer layers may be included between the bottom diffraction gratings 106, 116 and the top diffraction gratings 108, 118, i.e., layer 105 may not be used. In fact, if desired, the top diffraction gratings 108, 118 may be on the same layer as the bottom diffraction gratings 106, 116, in which case, top and bottom refers to the order in which the gratings are produced, i.e., the bottom diffraction grating being first and the top diffraction grating being second. Thus, the alignment target 100 is used to ensure that a first pattern produced on a first layer on the substrate is aligned with a second pattern produced on the same layer on the substrate.

In an alignment system, the bottom periodic patterns are on one element and the top periodic patterns are on a second element, where the first element and second element are movable with respect to each other. Further, there is a small separation between the top and bottom periodic patterns, with the ambient environment between the periodic patterns.

The dimensions of the patterns and the thicknesses of the layers may also be altered. For example, the bottom diffraction gratings 106, 116 need not extend to the top of layer 105.

Moreover, latent images may be used, and thus, the photoresist need not be developed to form diffraction gratings 108, 118, because the exposed photoresist has a different index of refraction than the unexposed photoresist.

In addition, it should be understood that either diffraction gratings 108, 118 or 106, 116 may actually be a continuous diffraction grating. Thus, for example, bottom diffraction gratings 106 and 116 may be one long pattern with top diffraction gratings 108 and 118 disposed over the top. Alternatively, top diffraction gratings 108 and 118 may be one continuous pattern disposed over the top of bottom diffraction gratings 106, 116. Because the present invention uses separate locations on the alignment target, however, the use of a single or separate periodic patterns does not matter. Consequently, it should be understood that discussion of two diffraction gratings, e.g., patterns 106 and 116, is intended to include two separate areas of a single continuous diffraction grating.

As can be seen in FIG. 2, overlay pattern 102 includes a designed in offset of +D between the top diffraction grating 108 and bottom diffraction grating 106. Thus, during processing, if the top diffraction grating 108 is produced over the bottom diffraction grating 106 with an offset exactly +D, the top diffraction grating 108 and the bottom diffraction grating 106 are perfectly aligned. If the top diffraction grating 108 is produced over the bottom diffraction grating 106 with some deviation from the offset +D, the deviation is the amount of the overlay error.

Overlay pattern 104 is similar to overlay pattern 102 but is mirror imaged, i.e., has an offset of −D. Because overlay patterns 102 and 104 are similar, the top diffraction gratings 108, 118 are designed to have the same line width (LWT), height (HT) and pitch (PT), while the bottom diffraction gratings 106, 116 are likewise designed to have the same line width (LWB), height (HB) and pitch (PB). In one exemplary embodiment, diffraction gratings 106, 116 may have a line width (LWB) of 200 nm, a line height (LHB) of 200 nm and a pitch (P) of 600 nm, while diffraction gratings 108, 118 may have a line width (LWT) of 200 nm, a line height (LHT) of 800 nm and a pitch (PT) of 600 nm. It should be understood that the alignment target 100 may be produced using various materials and the dimensions optimized for the materials used. Thus, the dimensions of the alignment target 100 may be altered to maximize sensitivity based on the types of materials used.

Because overlay pattern 102 and 104 are produced at the same time, during the same processing steps, any variation between the intended structure and the actual structure should be the same for both overlay pattern 102 and 104. Because overlay pattern 102 and overlay pattern 104 have the same amount of designed in offset D, but in opposite directions, the diffraction patterns produced by overlay patterns 102 and 104 will be the same. Consequently, if there is no overlay error, the detected light patterns from overlay pattern 102 and overlay pattern 104 will be the same.

However, because overlay pattern 102 has an offset of +D and overlay pattern 104 has an offset of −D, any overlay error will alter the offset in the two patterns differently, i.e., the symmetry between overlay pattern 102 and overlay pattern 104 is broken. For example, an overlay error of +e will increase the magnitude of the offset for overlay pattern 102 while decreasing the offset for overlay pattern 104.

FIG. 3 shows an alignment target 100', which is similar to alignment target 100 in FIG. 2, except that an overlay error of +e is introduced into the alignment target 100'. The overlay error of +e results in overlay pattern 102' having an offset vector with an absolute magnitude of D+e, and overlay pattern 104' having an offset vector with an absolute magnitude of D−e.

Accordingly, by calculating the difference between the measurements of diffracted light from overlay pattern 102 and overlay pattern 104, the amount of overlay error e can be accurately determined. For example, if there is no overlay error, the difference between the measurements will be zero (plus any system noise) due to the symmetry between overlay pattern 102 and overlay pattern 104. However, if there is an overlay error e, by calculating the difference in the diffraction measurements, the magnitude of the overlay error vector is functionally doubled i.e., |D+e|−|−D+e|=2e. Moreover, because the diffraction measurements from one overlay pattern is subtracted from the diffraction measurements from the other overlay pattern, systematic errors will be cancelled.

It should be understood that if desired, only one overlay pattern, e.g., overlay pattern 102 may be used and measured in two different positions. Thus, for example, an initial measurement is made, the top and bottom elements are then moved relative to one anther by a known amount D, and a second measurement is made. Thus, functionally, two measurements with designed in offsets have been made using only one overlay pattern. Alternatively, a library of spectra at different alignment error positions can be pre-generated and used to determine the alignment shift based on a measurement with the single overlay pattern.

Figure 4:
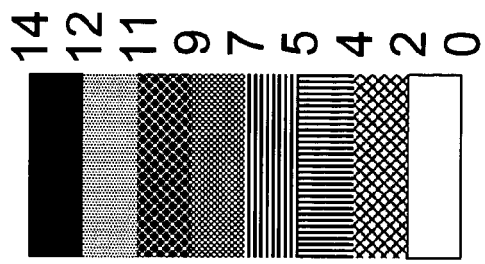
FIG. 4 is a sensitivity map for a diffraction pattern caused by a pattern similar to that shown in FIG. 2.
Figure 4:
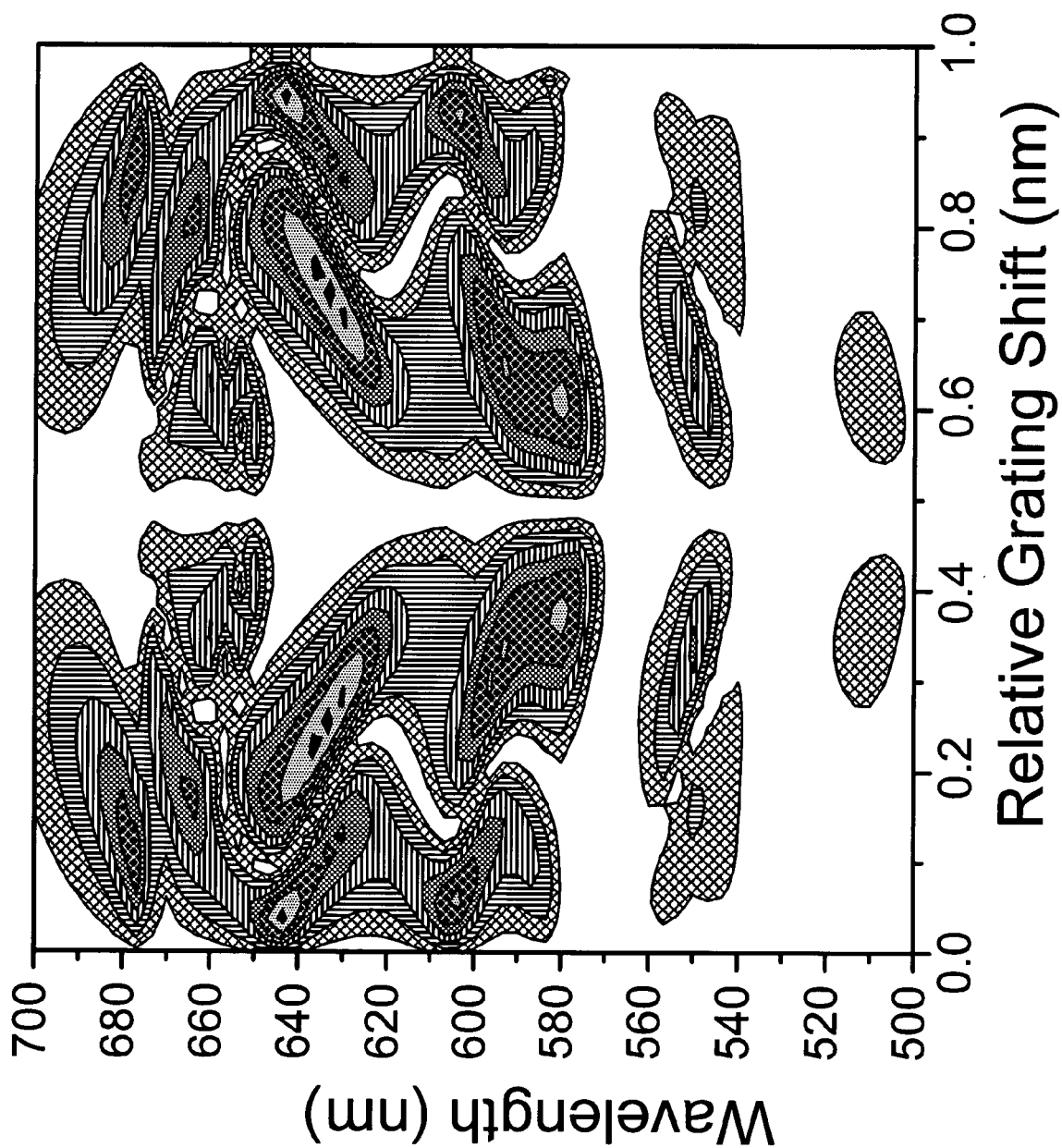

To understand why the accuracy of the alignment target 100 is improved, reference is made to FIG. 4, which is a sensitivity map for a diffraction pattern produced by a pattern similar to overlay pattern 102, but with no designed in offset. The sensitivity map of FIG. 4 shows the sensitivity of each wavelength to a relative grating shift, i.e., the top grating moves relative to the bottom grating, where the x axis shows the relative normalized grating shift of the diffraction gratings from 0 to 1, and the y axis is the wavelength of light from 500 nm to 700 nm. The sensitivity of each wavelength of light for each relative grating shift was calculated using the following equation:

$$S(\lambda_i, \varphi_j) = \frac{|R(\lambda_i, \varphi_j) - R(\lambda_i, \varphi_{j-1})|}{\varphi_j - \varphi_{j-1}} = \left|\frac{\partial R}{\partial \varphi}\right| \qquad \text{eq. 1}$$

where $R(\lambda_i, \phi_j)$ is the calculated reflectance at a particular relative grating shift for a particular wavelength and $R(\lambda_i, \phi_{j-1})$ is the calculated reflectance at the previous relative grating shift at the same wavelength, and the sensitivity $S(\lambda_i, \phi_j)$ is in arbitrary units ranging from 0 to 14.

As can be seen in FIG. 4, the sensitivity of an overlay pattern 102 is symmetrical about 0 and about 0.5, which correspond to perfect alignment between the top diffraction grating 106 and bottom diffraction grating 104 and a shift of 50% of the pitch, respectively.

Figure 5:
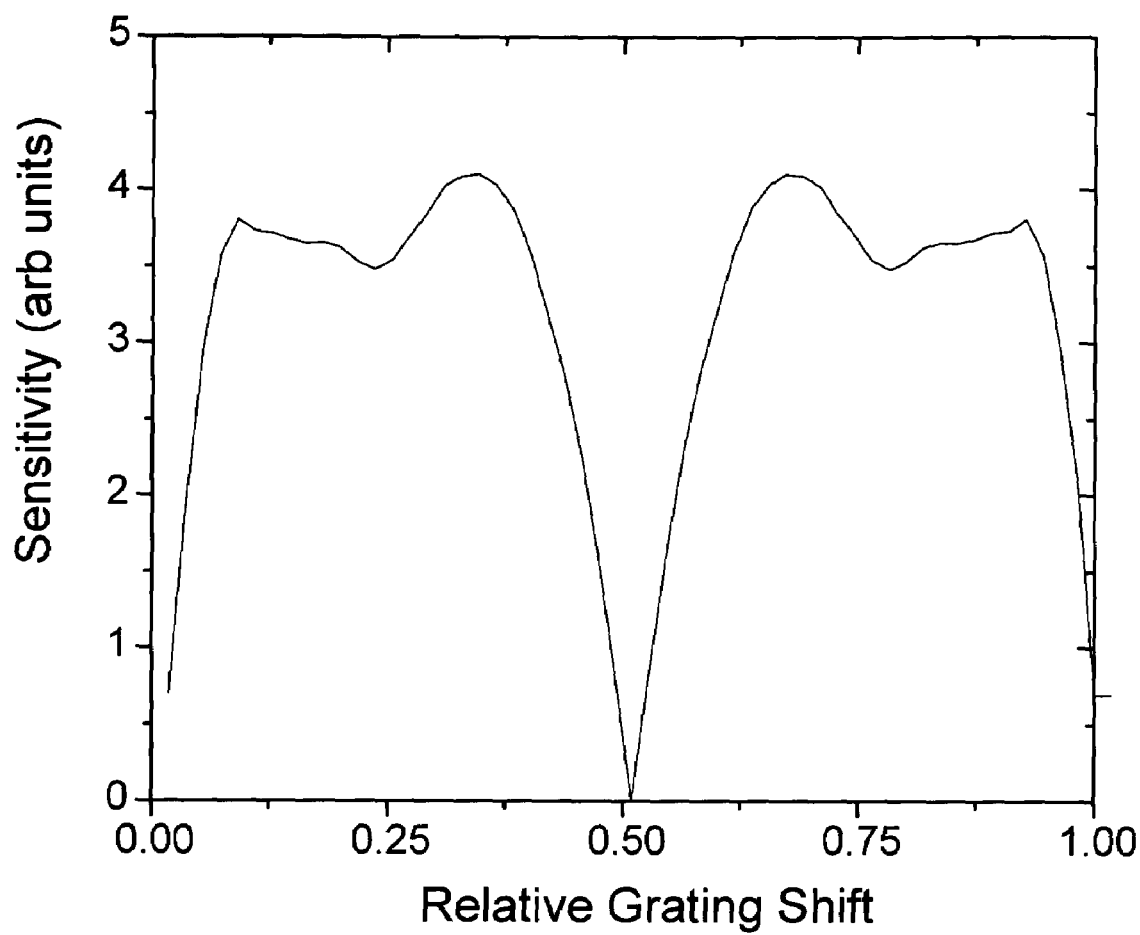
FIG. 5 is a graph showing the overlay sensitivity of a diffraction grating, where the x-axis is the relative grating shift and the y-axis is the sensitivity in arbitrary units.

FIG. 5 is a graph showing the overlay sensitivity of a diffraction grating, such as overlay pattern 102, where the x-axis is the relative grating shift and the y-axis is the sensitivity in arbitrary units. The sensitivity for each grating shift was averaged over the wavelength variable according to the following equation:

$$\langle S(\varphi) \rangle_\lambda = \frac{1}{N} \sum_{i=1}^{N} S(\lambda_i, \varphi) \qquad \text{eq. 2}$$

where N is the number of discrete wavelengths comprising the sensitivity spectrum. The slight shift of the curves in FIG. 5 to the right on the x axis is due the comparison of the reflectance for a current grating shift with the previous grating shift in equation 1. As can be seen in FIG. 5, maximum sensitivity lies between approximately 5% to 40% (and 60% to 95%) of the pitch P. While the maximum of the curves appears at approximately 34% and 66% of the pitch, there is a roll off between approximately 40% and 60%. Moreover, from inspection of the sensitivity map of FIG. 4 it can be seen that the various wavelengths are less sensitive to change when the relative grating shift is close to 50%.

Thus, in one embodiment, the designed in offset D in overlay patterns 102, 104 lies in the range of maximum sensitivity, as shown in FIG. 5. For example, the offset ±D may be approximately ±5% to 40% of the pitch, and more particularly ±95% of the pitch. Of course, the amount of offset may be altered to optimize sensitivity for the materials used and the dimensions of the patterns.

Figure 6:
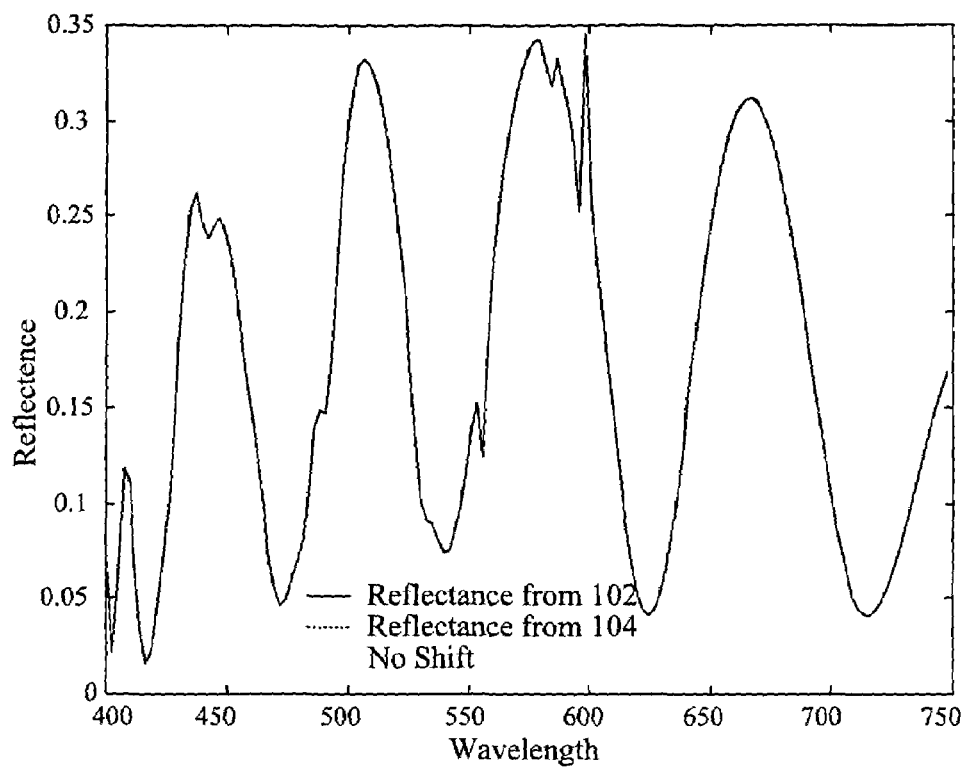
FIG. 6 shows the spectral reflectance from the alignment target in FIG. 2 when there is no overlay error.

FIG. 6 shows the spectral reflectance from alignment target 100 in FIG. 2 when there is no overlay error. The overlay pattern 102 has an offset of +D, while the overlay pattern 104 has an offset of −D. As can be seen in FIG. 6, as well as in FIGS. 4 and 5, when the same magnitude but different direction offset D is used, the resulting diffraction measurement from the two overlay patterns will be the same. It should be understood, that while FIG. 6 shows the spectral reflectance, any diffraction measurement, i.e., a measurement of any one or more of the diffractive orders, including the $0^{th}$ order, may be used. Moreover, the measurement may be made using a single wavelength, a plurality of discrete wavelengths, or a continuum of wavelengths.

Figure 7:
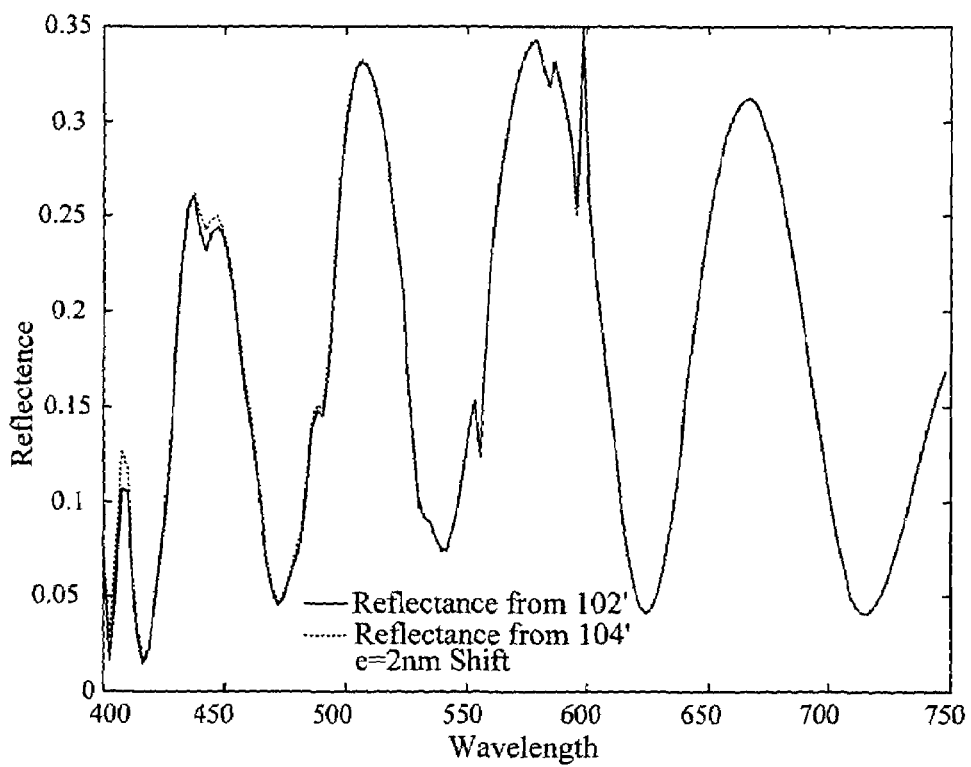
FIG. 7 shows the spectral reflectance from alignment target in FIG. 3, i.e., when a non-zero alignment error is present.

FIG. 7 shows the spectral reflectance from alignment target 100' in FIG. 3, i.e., when the alignment target includes a non-zero alignment error. For the purpose of FIG. 7, the overlay error is 2 nm, whereas the pitch is 400 nm, top line width is 100 nm, bottom line width 100 nm, the height HB is 200 nm and the height HT is 500 nm. As can be seen FIG. 7, when there is an overlay error, the spectral reflectance from overlay pattern 102' is different than that for overlay pattern 104'.

Figure 8:
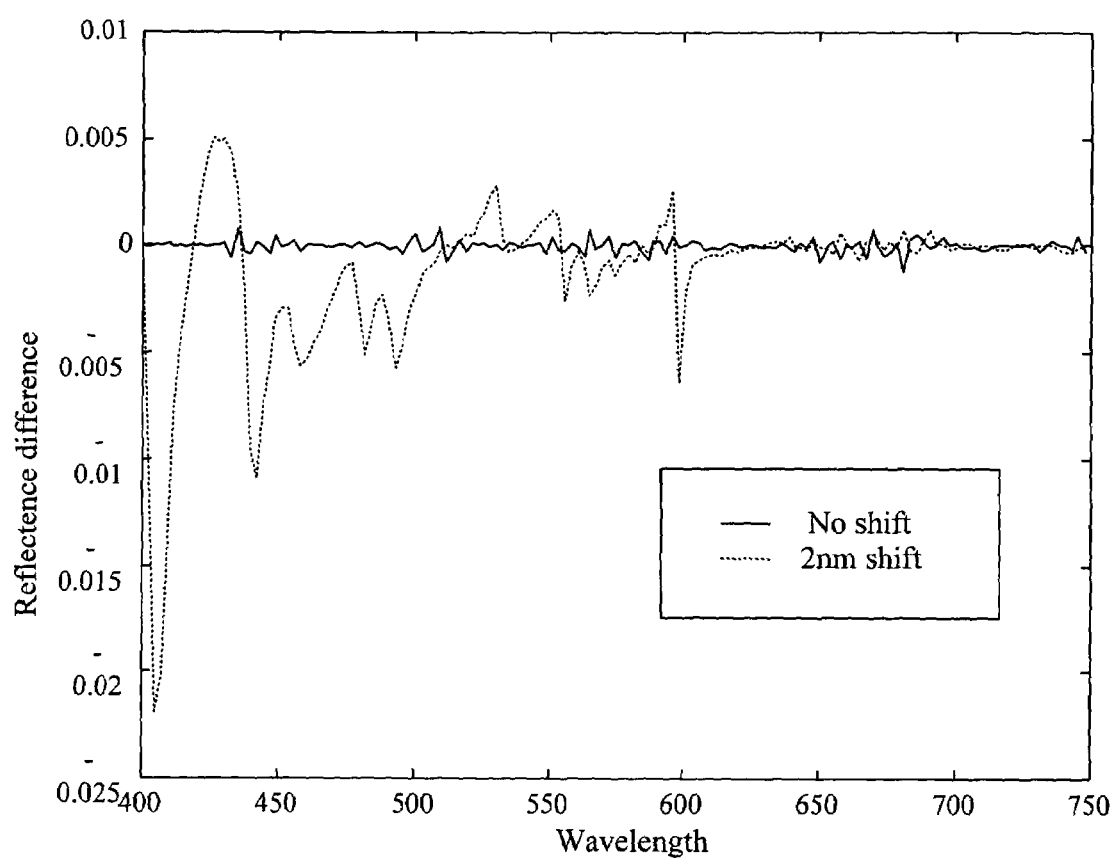
FIG. 8 shows the difference in the reflectances shown in FIGS. 6 and 7, i.e., when there is a zero and a non-zero alignment error.

FIG. 8 shows the difference in the reflectances shown in FIGS. 6 and 7, i.e., the reflectances for overlay patterns when there is no overlay error and when there is a 2 nm overlay error. As can be seen in FIG. 8, the difference in spectral reflectance between the overlay patterns 102 and 104 when there is no overlay error, is equal to approximately zero (except for a slight amount of noise that can be seen). However, there is a large difference in spectral reflectance between the overlay patterns 102' and 104', when there is small overlay error of 2 nm, particularly within wavelengths 400 to 600 nm. Thus, by calculating the difference between the measured diffraction of the two overlay patterns, small overlay errors may be observed.

Figure 9:
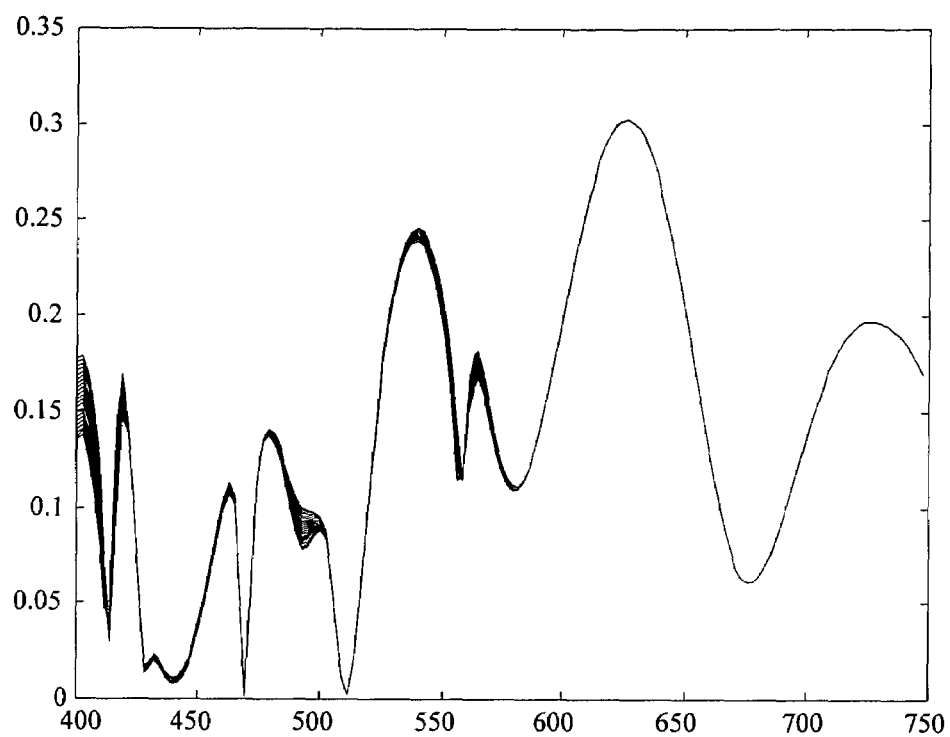
FIG. 9 is a graph showing the spectral reflectances from an overlay pattern, such as the overlay pattern shown in FIG. 2, with different offsets.

FIG. 9 is a graph showing the spectral reflectances from an overlay pattern, such as overlay pattern 102 in FIG. 2, with different offsets. The overlay pattern used to generate the data for FIG. 9 has a bottom diffraction grating height of 200 nm and line width of 100 nm and a top diffraction grating height of 500 nm and line width of 100 nm. The separation between the top and bottom diffraction gratings is 500 nm and the pitch of diffraction gratings is 400 nm. FIG. 9 shows the spectral reflectance for an offset of between 80 nm to 120 nm in 2 nm increments.

Figure 10:
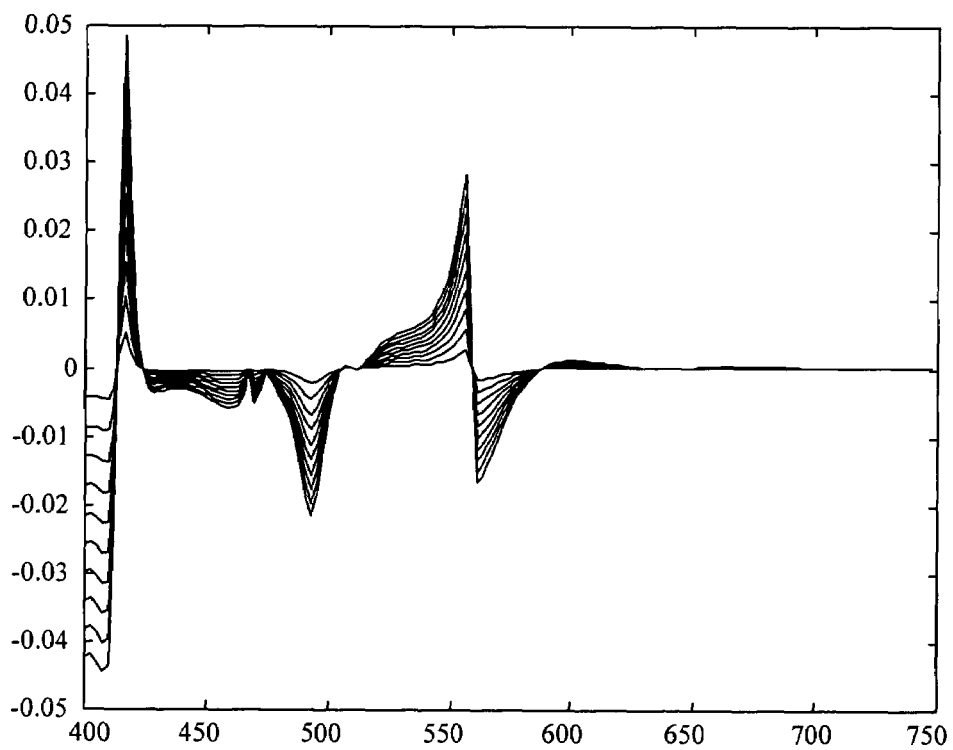
FIG. 10 is a graph showing the delta shift from 4 nm to 40 nm in spectral reflectances of FIG. 9.

FIG. 10 is a graph showing the delta shift from 4 nm to 40 nm in spectral reflectances of FIG. 9. In other words, FIG. 10 shows the difference between each spectral reflectance in FIG. 9 and the spectral reflectance for 80 nm. Thus, FIG. 10 shows the difference between the spectral reflectances for offsets of 80 nm and 84 nm, 80 nm and 88 nm, 80 nm and 92 nm, etc. . . . Because FIG. 9 shows the spectral reflectances for offsets of 80 nm to 120 nm at every 4 nm, the delta shift shown in FIG. 10 is from 4 nm (84 nm–80 nm) to 40 nm (120 nm–80 nm). As can be seen in FIG. 10, as the delta shift increases, the resulting difference in spectral reflectance increases.

Figure 11:
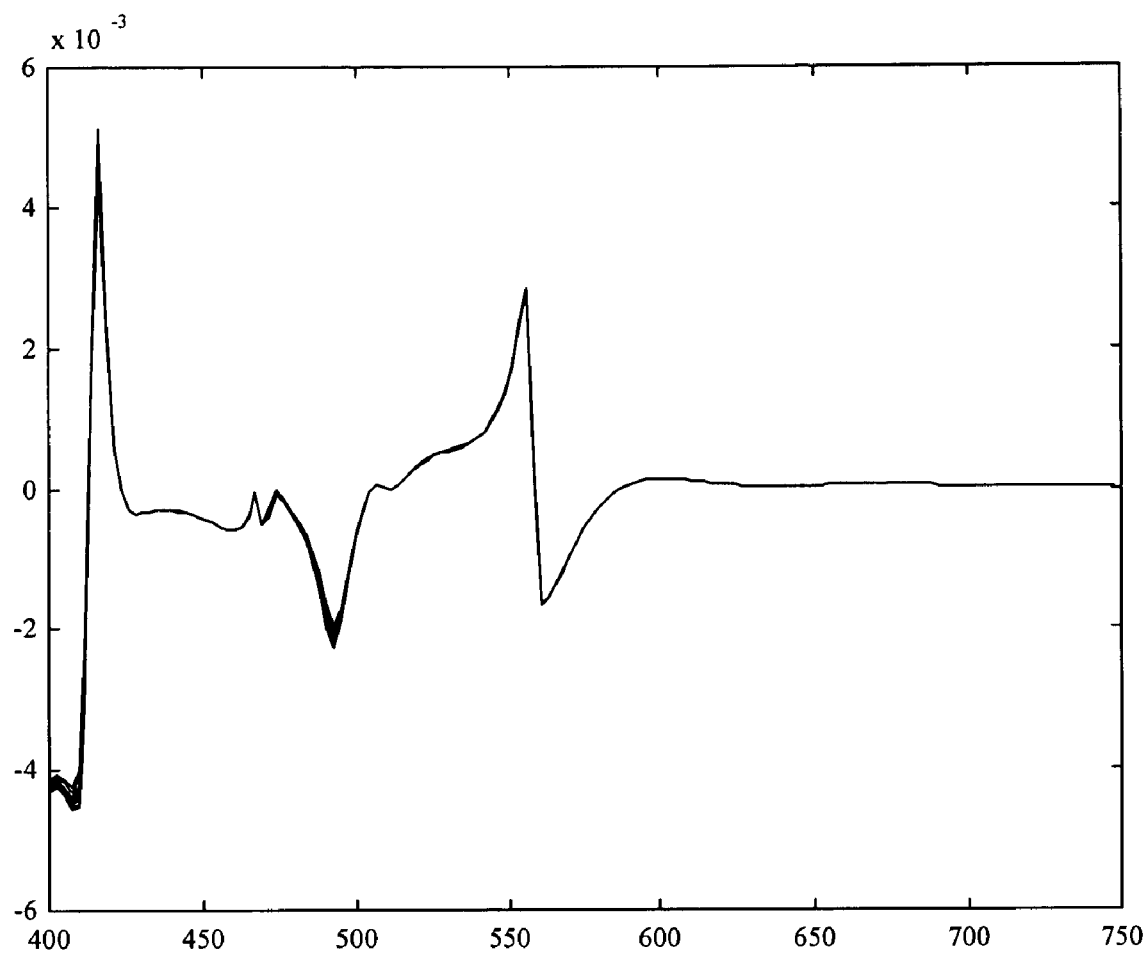
FIG. 11 is a graph showing the difference in spectral reflectances for neighboring offsets of FIG. 9, i.e., 84 nm–80 nm; 88 nm–84 nm, 92 nm–88 nm, etc. . . .

FIG. 11 is a graph showing the difference in spectral reflectances for neighboring offsets of FIG. 9, i.e., 84 nm–80 nm; 88 nm–84 nm, 92 nm–88 nm, etc. . . . Thus, FIG. 11 shows the difference between spectral reflectances for offsets ranging from 80 nm to 120 nm, where each difference is based on a difference in offset of 4 nm. As can be seen in FIG. 11, the differences in spectral reflectances are nearly identical, which indicates that the difference in the spectral reflectances is highly linear.

Alignment target 100 may be measured using several types of metrology devices, such as a normal incidence reflectometer, a non-normal incidence reflectometer, ellipsometer, scatterometer or other such device. FIG. 12A, for example, shows a block diagram of a normal incidence polarized reflectance spectrometer that may be used to measure alignment target 100. Spectrometer 120 is discussed in detail in the U.S. patent application entitled "Apparatus and Method for the Measurement of Diffracting Structures," filed Sep. 25, 2000, having Ser. No. 09/670,000, and the U.S. patent application entitled "Measurement Of Diffracting Structures Using One-Half Of The Non-Zero Diffracted Orders" filed Apr. 27, 2000, having Ser. No. 09/844,559, both of which have the same assignee as the present disclosure and are incorporated herein by reference. Spectrometer 120 may use rigorous coupled wave analysis (RCWA) as described in Ser. No. 09/670,000, or folded rigorous coupled wave analysis as described in Ser. No. 09/844,559 to measure overlay target 100.

As shown in FIG. 12A, spectrometer 120 is similar to a reflectometer, which is well known in the art. Spectrometer 120 includes a polychromatic light source 122 that generates a light beam that is partially reflected by beam splitter 124 along the optical axis 123. The light beam is directed towards a sample 126 having an overlay target, such as target 100, to be measured. Sample 126 may be, e.g., a semiconductor wafer or flat panel display or any other substrate, and is supported by a stage 128, which may be a polar coordinate, i.e., R-θ, stage or an x-y translation stage. Spectrometer 120 includes a rotatable polarizer 130 and a lens 132 (or series of lenses) to polarize and focus the light beam onto the sample 126 at normal incidence. The beam is reflected off sample 126 and the reflected light is transmitted through lens 132 and polarizer 130. A portion of the reflected light is transmitted through beam splitter 124 and is received by a spectrophotometer 134. Spectrophotometer 134 is coupled to processor 136, which analyzes the data provided by spectrophotometer 134. Processor 136 is e.g., a computer with a computer-usable medium having computer-readable program code embodied therein for causing the computer to determine the overlay error based on the light that is diffracted from the alignment target. Thus, the computer-readable program code causes the computer to calculate the difference between the diffracted light from the two locations and use the difference to determine if the alignment target is aligned. One of ordinary skill in the art can program code necessary to determine alignment in accordance with the present invention in view of the present disclosure. For more information on the general operation of a normal incidence polarized reflectance spectrometer, the reader is referred to Ser. Nos. 09/670,000 and 09/844,559, which are incorporated herein by reference.

If desired, other measurement routines may be used to measure overlay target 100 including ellipsometry and scatterometry. FIGS. 12B and 12C show block diagrams of a spectroscopic ellipsometer 140 and spectroscopic scatterometer 145. Ellipsometer 140 includes a broadband radiation source 141 and a spectrophotometer 142, which is connected to a processor 143. Spectroscopic scatterometer 145 includes a broadband radiation source 146 and a spectrophotometer 147, which is connected to a processor 148. As indicated by the arrows in FIG. 12C, one or both of broadband radiation source 146 and spectrophotometer 147 are adjustable to alter the angle of incidence. If a non-normal metrology device, such as an ellipsometer or scatterometer is used with the alignment target of the present invention, the azimuthal angle is preferably perpendicular to the lines of the diffraction grating. Alternatively, the azimuthal angle may be oriented at an arbitrary angle with respect to the grating lines. The same azimuthal angle should be used for the measurement at both locations. If desired, different azimuthal angles may be used for the measurement of each location on the alignment target if the angles are perpendicular or anti-parallel to each other. The operation of an ellipsometer 140 and spectroscopic scatterometer 145 is well known to those skilled in the art. Processor 143 and 148 may be similar to processor 136 shown in FIG. 12A.

It should also be understood, that the present invention may use a single wavelength, a plurality of discrete wavelengths, or a continuum of wavelengths. For example, referring to FIG. 8, it can be seen that the measurement is extremely sensitive at wavelengths of approximately 410 nm. Thus, single wavelength measurements at, e.g., 410 nm may be particularly useful.

Figure 13A:
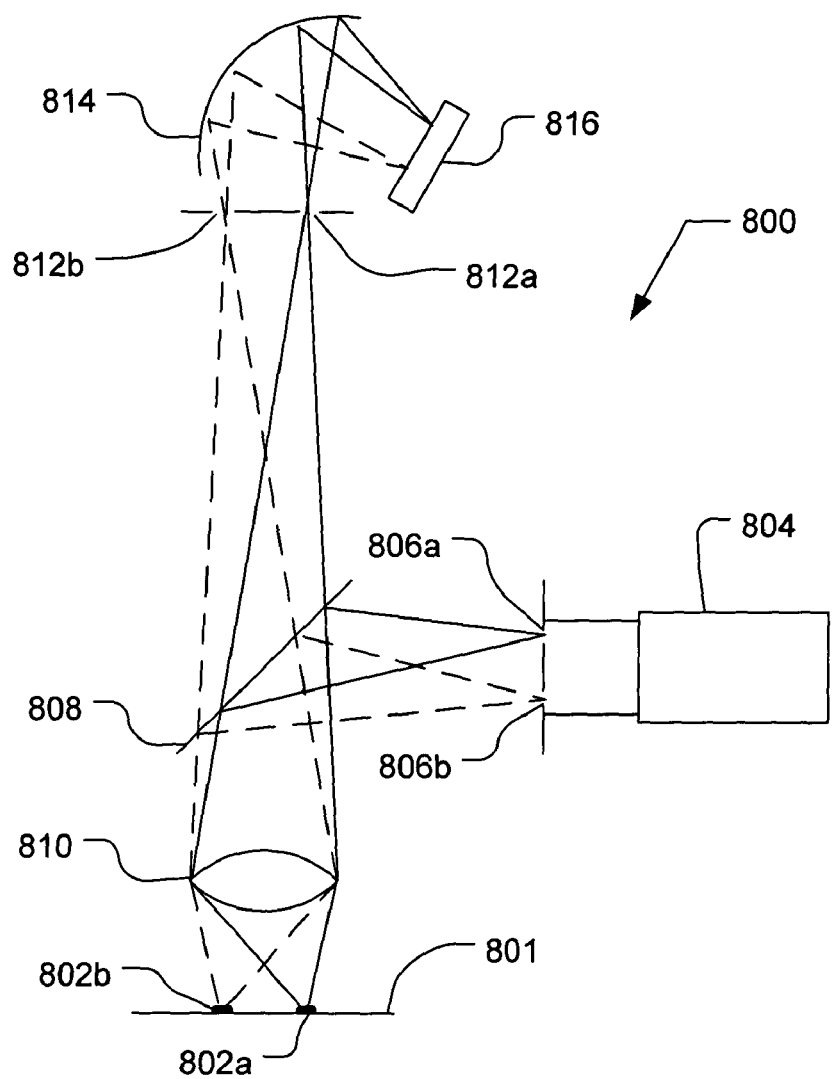
FIGS. 13A and 13B shows a spectrometer in which multiple targets on a sample are illuminated and measured simultaneously.

In one embodiment, the spectrometer apparatus detects the spectra from multiple targets at the same time. For example, as shown in FIG. 13A, a spectrometer 800 in which multiple targets 802a and 802b on a sample 801 are illuminated simultaneously. The spectrometer 800 includes a broadband illumination source 804 that produces light through a number of circular apertures 806a, 806b. As shown in FIG. 13A, two beams are produced that reflect off a beam splitter 808 and are focused by an objective lens 810 to selectively illuminate desired locations, i.e., the two targets 802a, 802b, on the sample 801. The two targets are, e.g., the overlay patterns 102 and 104 shown in FIG. 2.

The light diffracted from the targets 802a, 802b is focused by objective lens 810 onto the spectrometer entrance apertures 812a and 812b after passing through beam splitter 808. The light is incident on an imaging spectrometer grating 814 and is collected by a two-dimensional array detector 816, such as a CCD detector. Thus, the light scattered by targets 802a and 802b is selectively collected. The spectra for each target are dispersed along one dimension of the detector 816. If additional overlay patterns are used, additional beams may be produced with additional circular apertures 806 and with additional spectrometer entrance apertures 812.

Figure 13B:
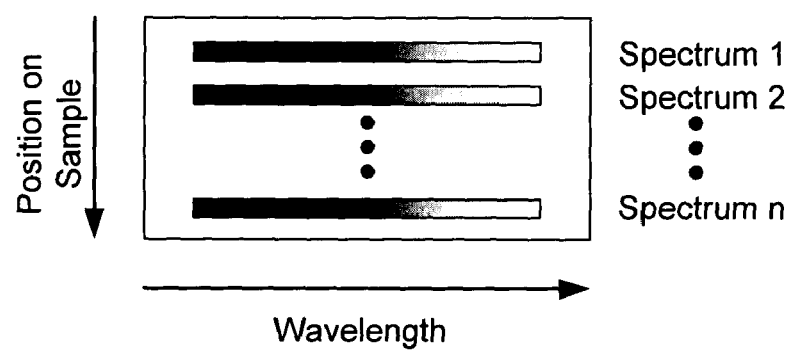

FIG. 13B shows a front view of the detector 816, where the X-axis is wavelength of the spectra and the Y-axis is the position on the sample for each spectrum, i.e., the spectra produced by the first, second, to n targets. The spectra associated with specific locations on the sample are separated along the direction perpendicular to the direction of the spectral dispersion by sufficient distance that light from one location does not leak into the spectrum of another location.

As shown in FIG. 13A, spectrometer 800 works well with an X-Y stage. If an R-θ stage, additional optics such as an image rotator, e.g., a dove prism, may be inserted below the beamsplitter, allowing the image of the sample to be rotated to match the spectrometer and illumination apertures.

Figure 14A:
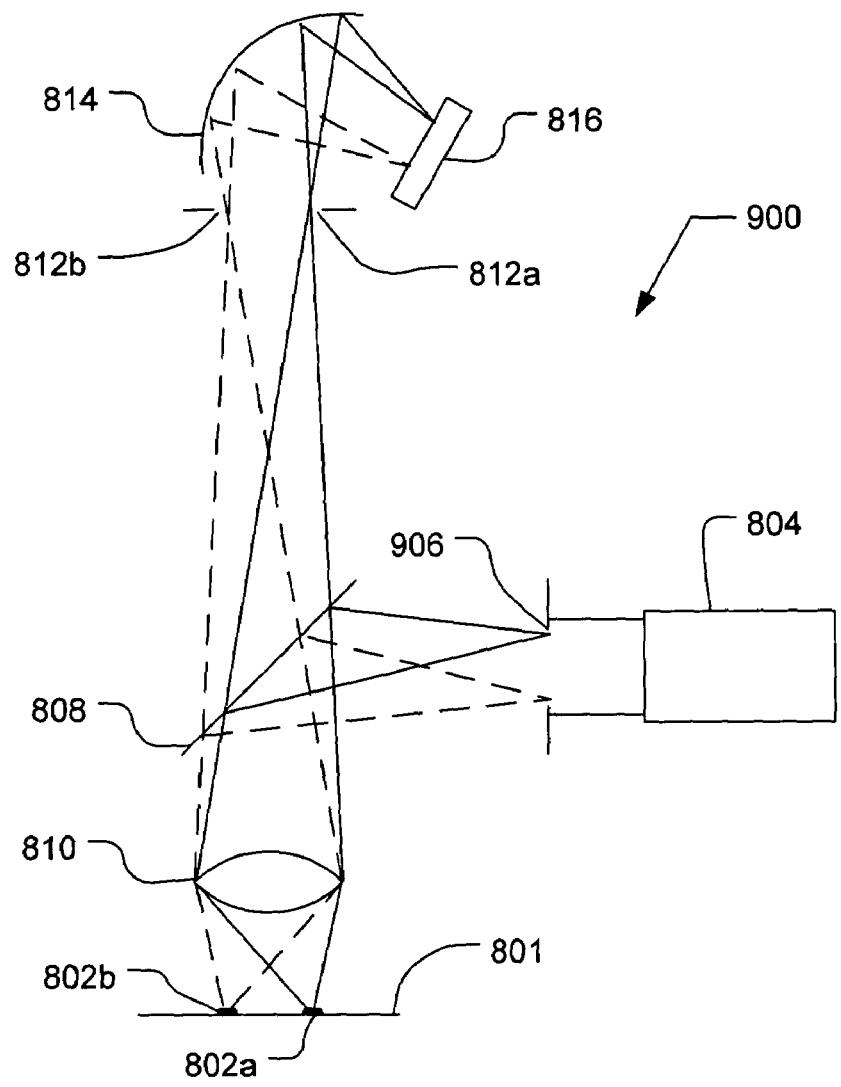
FIGS. 14A and 14B shows another embodiment of a spectrometer in which multiple targets on a sample are illuminated and measured simultaneously.
Figure 14B:
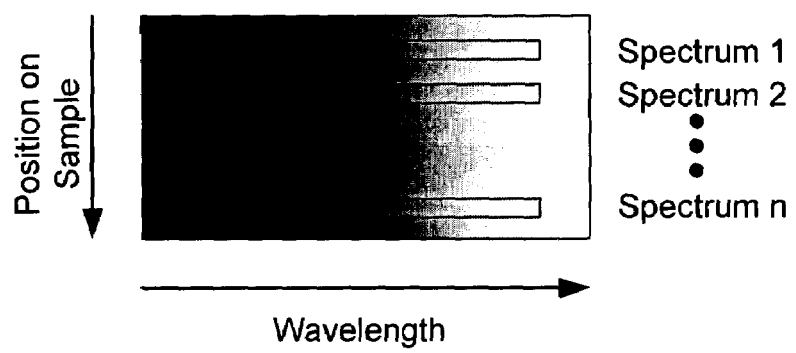

FIGS. 14A and 14B show another embodiment of a spectrometer 900 that may be used to detect the spectra from multiple targets at the same time. As shown in FIG. 14A, spectrometer 900 is similar to spectrometer 800, except that an illumination slit 906 is used in place of a plurality of circular apertures 806a, 806b in FIG. 13A. Consequently, more area of sample 901 will be illuminated. Spectrum isolation is achieved, as shown in FIG. 14B, by electronically binning only the rows of the detector that correspond to each target on the sample. All other light collected is not used.

The measurement of all locations simultaneously is particularly advantageous in an alignment process when the top element and bottom element are moving with respect to each other. If the measurements are not made simultaneously, the top and bottom elements should be held stationary while the measurement are made.

As discussed above, the alignment target may be used advantageously to assist in the alignment process, i.e., aligning two separate elements. Thus, for example, the present invention may be used to assure substrate to reticle registration when the substrate is on the exposure tool during processing. The present invention, of course, is not limited to exposure tools, but may be used to assist in the precise alignment of any separate elements.

Figure 15:
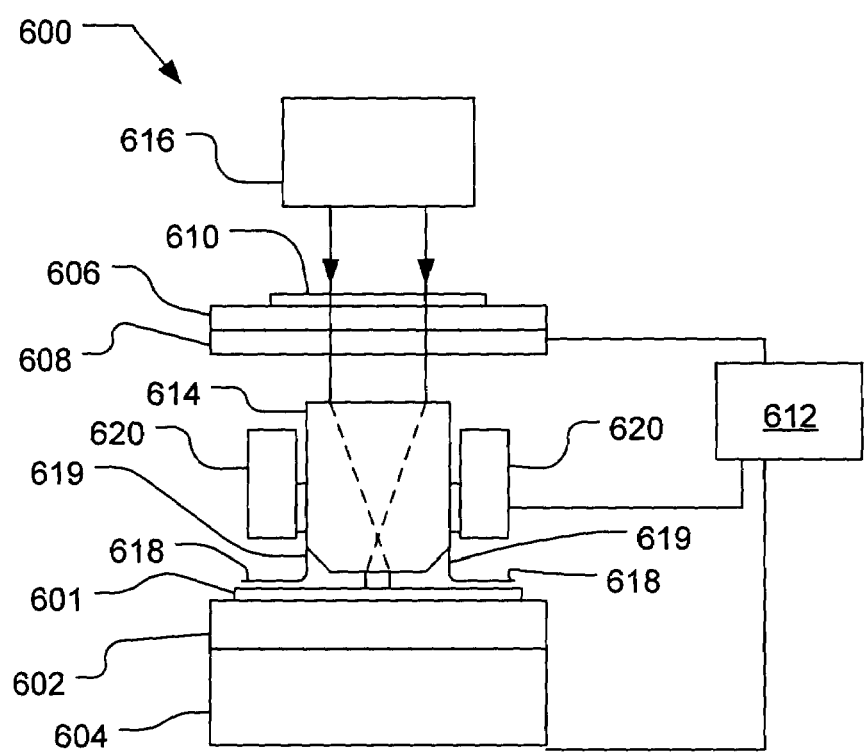
FIG. 15 is a block diagram of an exposure tool, with which the present invention may be used.

FIG. 15 is a block diagram of an exposure tool 600 with which the present invention may be used. Exposure tool 600 includes X and Y substrate stages 602 and 604 that hold the substrate 601. The exposure tool 600 also includes X and Y reticle stages 606 and 608 that hold the reticle 610. Exposure tool 600 may include two sets of stages, one set for large motions and another set for fine motions. For sake of simplicity, X and Y stages 602, 604, 606, and 608 may be used for both large motion and fine motion.

A control system 612 controls the motion of the stages. A lens 614 or other suitable optics is positioned between the substrate 601 and the reticle 610 and is used to focus light from light source 616 that is transmitted through reticle 610 onto substrate 601. The operation and control of exposure tools is well known in the art.

A reference mask 618 extends from the lens 614 by way of a low thermal expansion arm 619. Spectrometers 620 are positioned above reference masks 618. As shown in FIG. 15, a plurality of reference masks 618 may be used, each having an associated spectrometer 620.

Figure 16:
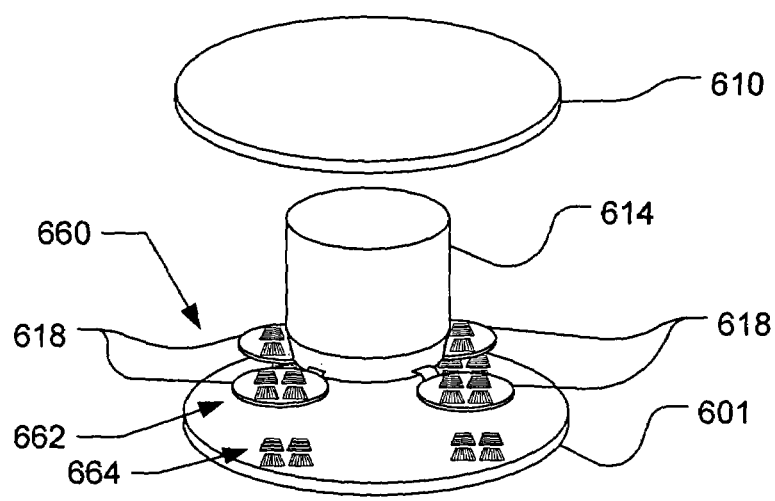

FIG. 16 shows a perspective view of substrate 601 and reticle 610 with lens 614 and four reference masks 618 disposed between the substrate 601 and reticle 610. The spectrometers 620 are not shown in FIG. 16. As can be seen in FIG. 16, a number of separate alignment targets 660 are used, where the top diffraction gratings 662 is on the reference masks 618 and bottom diffraction gratings 664 is on the substrate 601.

Referring back to FIG. 15, the spectrometers 620 may be coupled to the lens 614 as shown in FIG. 15, or may be connected to another stationary object. The spectrometers 620 communicate with the control system 612. The control system 612 includes, e.g., a computer-usable medium having computer-readable program code embodied therein for causing the control system to calculate the difference between the diffracted light from the two locations and using the difference to determine if the first element and the second element are aligned. The control system 612 is coupled to the stage to adjust the location of the substrate 601 in response to the signals provided by spectrometer 620 until the starting position of the substrate 601 is precisely aligned with the lens 614. Once the substrate 601 is aligned, the control system 612 can move the stages to perform the desired exposure operation.

Figure 17:
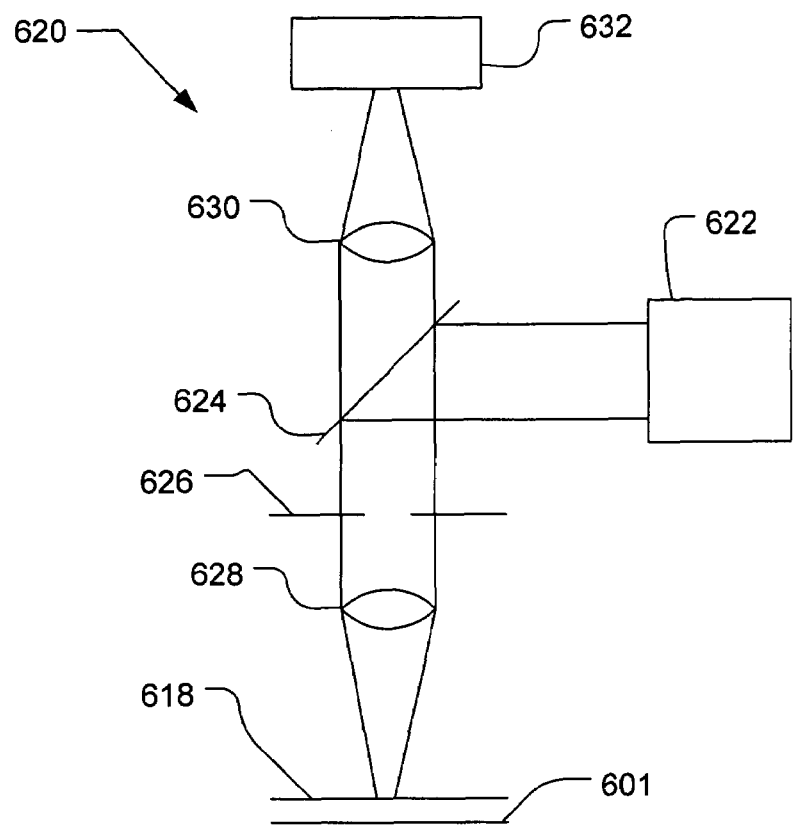
FIG. 17 shows a schematic view of a spectrometer that may be used with an alignment system in the present invention.

FIG. 17 shows a schematic view of a spectrometer 620 that may be used in the present invention. Spectrometer 620 includes an illumination source 622 that produces radiation that is reflected off beam splitter 624. The radiation passes through an aperture 626 and lens 628 and is focused on the reference mask 618 and the substrate 601. The incident radiation reacts with, e.g., is diffracted by, the alignment target, which includes the periodic pattern on the reference mask and the periodic pattern on the substrate. After reacting with the alignment target, the radiation passes through lens 628, aperture 626, and beam splitter 624 and is focused by another lens 630 onto the detector 632.

Illumination source 622 produces radiation, e.g., polychromatic light, that will not expose the photoresist on substrate. Thus, for example, light in the visible spectrum may be used, where the photoresist is UV sensitive. The distance between the reference mask 618 and the substrate 601 should be small, e.g., between 1 and 10 μm. Moreover, the objective lens 628 should have a small NA, e.g., between 0.02 and 0.005, such as 0.01. A small NA minimizes errors that may be caused by a non-zero angle of incidence.

Figure 18A:
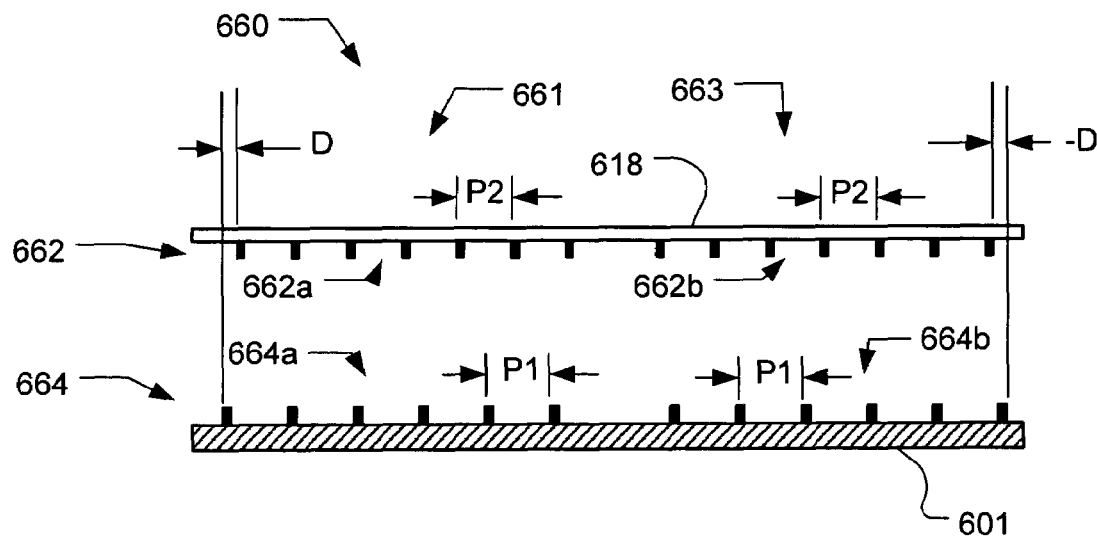
FIG. 18A shows a cross-sectional view of alignment target, in accordance with an embodiment of the present invention.

FIG. 18A shows a cross-sectional view of alignment target 660. As discussed in reference to FIG. 2, alignment target 660 includes two locations, referred to as overlay patterns 661, 663, where there is a designed in offset of equal magnitude but in opposite directions. Alignment target 660 includes a periodic pattern on each element, e.g., a diffraction grating 662 on the reference mask 618 and diffraction grating 664 on the substrate 601 (which includes some layer on the substrate). The top diffraction gratings 662 may include two separate diffraction gratings 662a and 662b or may be a single continuous grating. The bottom diffraction gratings 664 may also include two separate diffraction gratings 664a and 664b or may be a single continuous diffraction grating.

When properly aligned, top diffraction grating 662a will be offset by an amount +D from the bottom diffraction grating 664a at one location, i.e., at the end of the periodic pattern, and the top diffraction grating 662b will be offset by an amount −D from the diffraction grating 664b at another location, i.e., at the other end of the periodic pattern. Thus, as can be seen in FIG. 18A, alignment target 660 is similar to alignment target 100, and thus, the alignment error between the top diffraction gratings 662 and the bottom diffraction gratings 664 can be easily determined as discussed above. For example, the spectra at the two overlay patterns can be measured. The control system 612 may calculate the difference between the spectra. If the substrate 601 and reference mask 618 are mis-aligned, there will be a non-zero difference. As the substrate 601 is moved by the stage into alignment with the reference mask 618, however, the difference between the spectra will converge on approximately zero (some noise may be present). Thus, once the difference is approximately zero, the substrate 601 and reference mask 618 will be in alignment.

To align the two elements, the radiation that reacts with the periodic patterns at the two locations on the alignment target is detected and the difference is calculated. If the difference is non-zero, the two elements are moved relative to each other and the difference is recalculated. If the difference is less than the previous measurement, the two elements are moved again in the same direction. The process continues until the difference is minimized. If the difference is increased, the two elements are moved relative to each other again, but in the opposite direction. The process is continued until the difference is minimized.

The process can be optimized using a referencing technique, similar to that described in U.S. patent application entitled "Alignment Target with Designed in Offset" by Weidong Yang, Roger R. Lowe-Webb, having Ser. No. 10/116,863, which is incorporated herein by reference. The reference technique, for example, may include moving the two elements with respect to one another over a distanced and recording the change in the differential spectrum caused by the movement. The change in the differential spectrum as the alignment between the top element and the bottom element changes acts as a reference to determine the precise amount of alignment error.

Additionally, if desired, bottom diffraction gratings 664a, 664b and top diffraction gratings 662a, 662b may have difference pitches. For example, bottom diffraction gratings 664a, 664b have a pitch of P1, while the top diffraction gratings 662a, 662b have a pitch P2 that is equal to pitch P1 plus an additional term δ, i.e., P2=P1+δ. The difference in pitch may be, e.g., 10 percent, or any other appropriate amount.

In operation, the incident radiation reacts with the alignment target at the two locations. After reacting with the alignment target, the radiation is detected. Because the top diffraction gratings 666, 668 and the bottom diffraction gratings 662, 664 have different pitches, a moiré fringe pattern will be produced.

The use of moiré fringe patterns in alignment devices is described in U.S. Pat. No. 5,216,257, which is incorporated herein by reference. As described in U.S. Pat. No. 5,216,257, however, a single top diffraction grating and single bottom diffraction grating was used. U.S. Pat. No. 5,216,257 teaches that after deposition and development, the single resultant moiré fringe pattern can be observed and measured on the wafer structure. The overlay error can then be determined by the displacement of the centerline of the fringe from the centerline of the grating structure.

In accordance with the present invention, however, the pre-alignment of the substrate 601 may be accomplished in exposure tool 600 using alignment targets 660 prior to exposure and development. At least two moiré fringes are produced, e.g., one by both overlay patterns 601, 603 in alignment target 660, and are received by detector 603. The two moiré fringes are compared to each other to determine if the elements are in alignment. When there is no alignment error, the moiré fringes produced by overlay patterns 601 and 603 will be the same because the overlay patterns are symmetrical. However, if there is an alignment error, the error will create an asymmetry between overlay patterns 601 and 603. For example an alignment error +e will change the magnitude of the offset of overlay pattern 601 by |D+e|, while changing the magnitude of the offset of overlay pattern 603 by |D−e|. Thus, the moiré fringes produced by the asymmetrical overlay patterns will be different. By calculating the difference between the moiré fringes produced by overlay patterns 601 and 603, the presence and general magnitude of any alignment error may be quickly and accurately determined. Thus, the control system 612, which may include some intermediary processor, receives the light detection signals from detector 603 and calculates the difference between the moiré fringes created by overlay patterns 661 and 663 (as well as the moiré fringes created by the overlay patterns in alignment target 650). Control system 612 can then move the substrate stage in the appropriate manner and distance for precise pre-alignment.

Figure 18B:
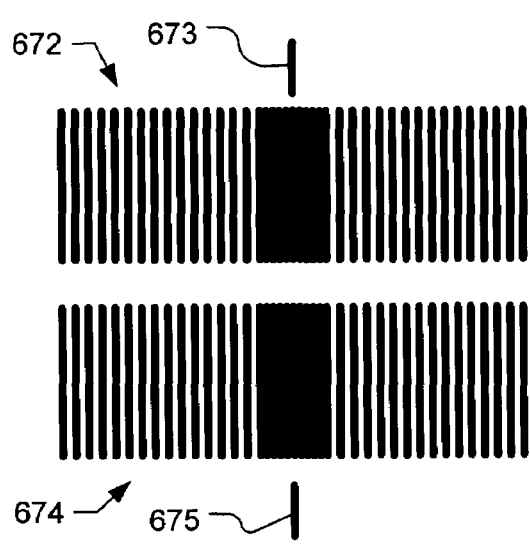
FIGS. 18B and 18C show examples of moiré fringes produced by overlay patterns in an alignment target when the elements are in and out of alignment, respectively.
Figure 18C:
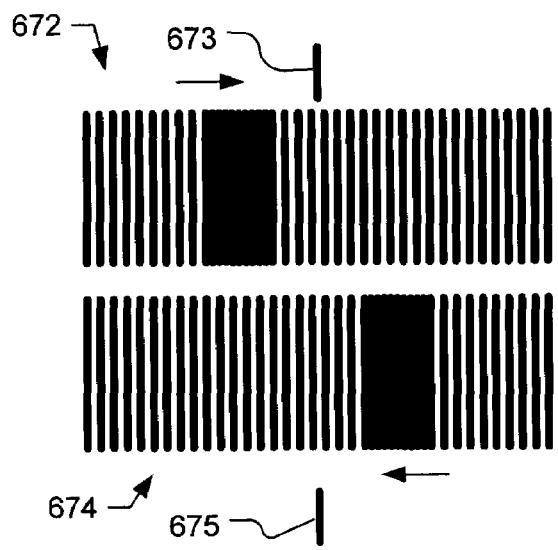

FIG. 18B shows an example of moiré fringes 672, 674 produced by overlay patterns 601 and 603 when the reference mask 618 and substrate 601 are in alignment. As can be seen, the bands in the moiré fringes are aligned with each other. Alternatively, the bands may be viewed as being in the same relative position with respect to a reference point, e.g., center lines 673, 675. FIG. 18C shows an example of moiré fringes 672, 674 produced by overlay patterns 601 and 603 when the reference mask 618 and substrate 601 are not in alignment. As can be seen, the bands in the moiré fringes 672, 674 are no longer aligned with respect to each other, or alternatively, the bands do not have the same relative position with respect to the reference point, e.g., center lines 673, 675. As the reference mask 618 and the substrate 601 approach alignment, the bands in the moiré fringes 672, 674 will approach each other, as indicated by the arrows in FIG. 18C.

It should be understood that in accordance with the present invention, the position of the bands may be determined relative to each other or relative to some reference point. The reference point need not be a center line.

Thus, by detecting the bands in the moiré fringes and determining the relative positions of the bands, it may be determined if the substrate 601 and the reference mask 618 are in alignment. If the substrate 601 and the reference mask 618 are out of alignment, the control system 612 can move the stage holding the substrate 601 until the bands of the moiré fringes are in the same relative position, thus, assuring that the substrate 601 and the reference mask 618 (and therefore the lens 614) are in alignment. Once the substrate 601 is pre-aligned, the substrate 601 may then be processed by the exposure tool 600.

Figure 19A:
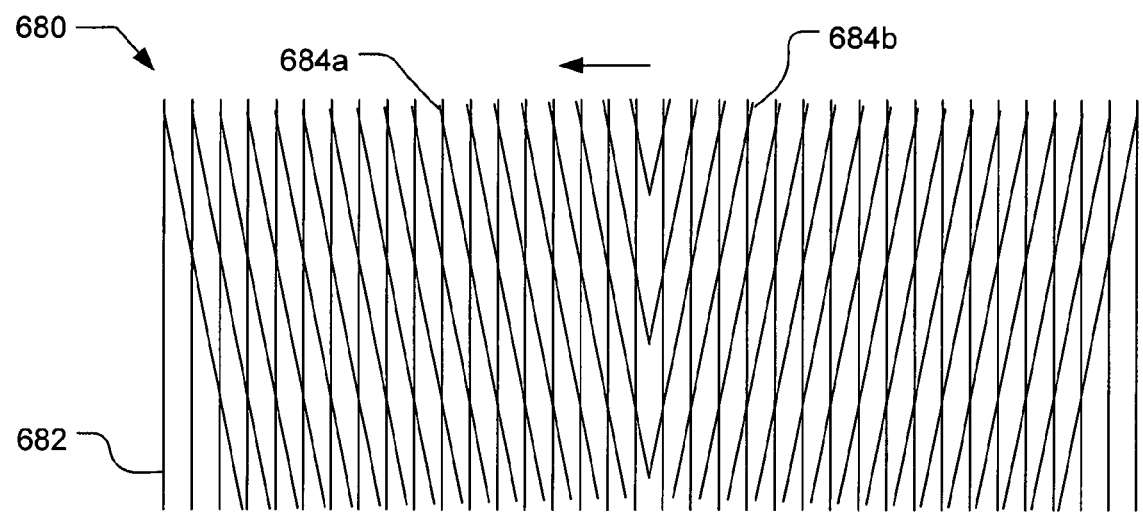
FIG. 19A shows a cross-sectional view of another alignment target that may be used to produce moiré fringe patterns.

FIG. 19A is another example of an alignment target 680 that includes a designed in offset and that may be used to produce moiré fringe patterns. As shown in FIG. 19A, the top periodic patterns 684a and 684b are offset from the bottom periodic pattern 682 by an angle, i.e., the top periodic patterns 684a and 684b are rotated with respect to the bottom periodic pattern 682. The top periodic patterns 684a and 684b are rotated in opposite directions. As shown in FIG. 19A, the top periodic patterns 684, 684b may be touching or if desired there may a separation between them.

Figure 19B:
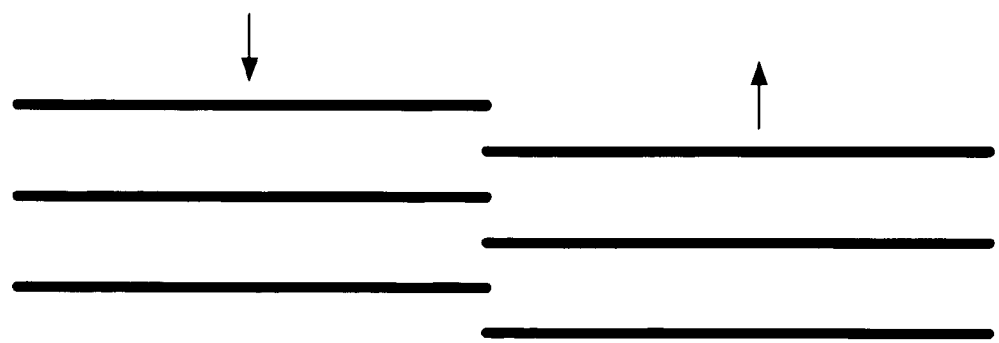
FIG. 19B illustrates the moiré fringes produced by the alignment target of FIG. 19A.

In operation, when the top periodic patterns 684a, 684b are properly aligned with the bottom periodic pattern 682, moiré fringe patterns are generated that are aligned. However, if there is an alignment offset between the top and bottom periodic patterns, the moiré fringe patterns will separate, as shown in FIG. 19B. For example, if the top periodic patterns 684a and 684b move to the left over bottom periodic pattern 682, as illustrated by the arrow in FIG. 19A, the moiré fringe patterns produced by the periodic patterns 684a and 682 will move down, while the moiré fringe patterns produced by the periodic patterns 684b and 682 will move up. Thus, by moving the top element with respect to the bottom element, the moiré fringe patterns from patterns 684a and 684b will move in opposite directions. By imaging the moiré fringe patterns and observing when the bands are aligned, the top and bottom element can be placed into proper alignment. Moreover, by measuring the separation between the moiré fringe patterns, the amount of the alignment error may be determined.

It should be understood that the reticle 610 may be similarly pre-aligned with the lens 614. Thus, where both the reticle 610 and substrate 601 are pre-aligned with the lens 614, the reticle 610 and substrate 601 will be aligned with respect to each other.

It should also be understood that the present invention is not limited to pre-alignment, but may be used with the exposure tool 600 during exposure. For example, with judicious placement of a plurality of bottom diffraction gratings 604a, 604b on substrate 601, for example, in the scribe lines around each die or neighboring dies on the substrate 601, alignment may be performed prior to or during exposure for each die. Further, other alignment device embodiments may be possible using the alignment target of the present invention. For example, in an exposure tool, the top diffraction grating may be placed on the reticle 610. The reticle 610 and substrate 601 may then be aligned with respect to each other. In such an embodiment, for example, high orders of scattered light may be detected and used to determine alignment after the incident light travels through the top diffraction gratings on the reticle and lens, and is scattered off the bottom diffraction gratings on the substrate. The collected higher orders may be used to from images and moiré patterns.

It should also be understood, that while the present embodiment is described in terms of two overlay patterns in each alignment target 660, if desired the alignment target may use three or four overlay patterns as described in U.S. patent application entitled "Alignment Target with Designed in Offset" by Weidong Yang, Roger R. Lowe-Webb, and John D. Heaton, Ser. No. 10/116,863, which is incorporated herein in its entirety. The use of additional overlay patterns may provide the ability to calculate the amount of misalignment, which may eliminate the need to use a feedback mechanism to determine if the relative movement of the elements is decreasing or increasing the difference in the detected radiation from each location on the alignment target.

Moreover, while the present embodiment is described in terms of an exposure tool used in the semiconductor industry, the present invention may be used in any apparatus or process in which precise alignment between two elements is required. For example, the present invention may be used advantageously in technologies in which small elements must be aligned, such as biotechnology or nanotechnology, or in technologies in which very precise alignment of larger elements, e.g., a reticle and stage, is desirable.

Figure 20:
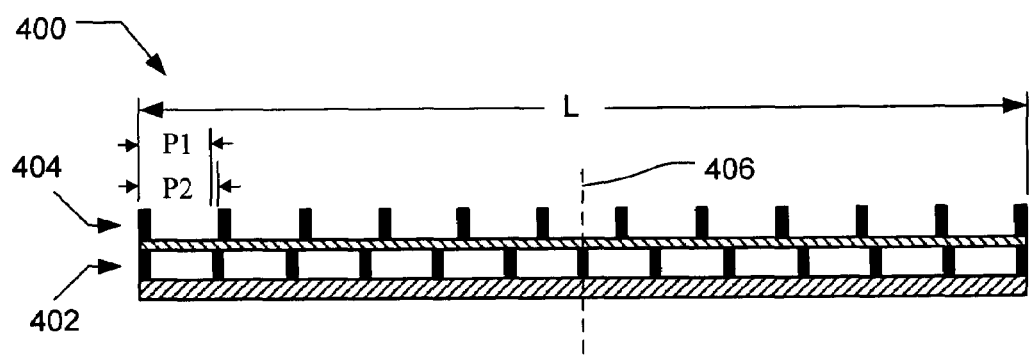
FIG. 20 is another alignment target, in accordance with another embodiment of the present invention.

FIG. 20 is another alignment target 400 that may be used in accordance with an embodiment of the present invention. Alignment target 400 includes a bottom periodic pattern, e.g., diffraction grating 402 and a top periodic pattern, e.g., diffraction grating 404. The bottom diffraction grating 402 has a pitch P1. The top diffraction grating 404 has a pitch P2 that is equal to pitch P1 plus an additional term δ, which is a small fraction of pitch P1, i.e., P2=P1+δ. The linear dimension L perpendicular to the grating lines of alignment target 400 should be sufficient to ensure that all phases between 0 and 360 degrees is included, i.e., $$L = \left(\frac{P1}{\delta} + 1\right) \cdot P1. \qquad \text{eq. 3}$$

Consequently, the overlay pattern of alignment target 400 is mirror imaged around a line 406 due to the variation in pitch. In other words, the alignment of the top diffraction grating 404 with the bottom diffraction grating 402 is designed to be mirror imaged at the same lateral distance on either side of line 406. Thus, similar to alignment target 400, if an overlay error e is inserted, the variation in alignment at the locations on the alignment target 400 at the same lateral distance on either side of line 406 will be 2e. FIG. 20 shows line 406 in the center of alignment target 400. It should be understood, however, that the length L of alignment target 400 need not be longer than is necessary to include all phases between 0 and 360 degrees, in which case, the line 406 may not be located in the center of the lateral dimension of alignment target 400.

Any appropriate metrology instrument, such as those described in FIGS. 12A–12C, may be used to measure at least two locations on the alignment target 400. The diameter of the probe spot used to measure alignment target 400, however, should have a lateral dimension, i.e., in the direction perpendicular to the grating lines, that is sufficiently small that the variation in the lateral offset between the lines of the bottom diffraction grating 402 and the top diffraction grating 404 within the probe spot is small compared to pitch P1. The measurement of diffracted light, i.e., the $0^{th}$ order and/or any number of higher order diffracted beams, is made at least at two locations on the alignment target 400, where there is a designed in offset of approximately equal magnitude but in opposite directions. Thus, for example, if the length L of the pattern includes a 360 degree cycle of phases, the two locations on the alignment target 400 are measured at equal distances from the respective ends, or alternatively from the center of the pattern. Alternatively, a plurality of lateral positions along the alignment target 400 may be measured. If desired, a third location on the pattern may be measured as a reference offset to calculate the alignment error, as described in U.S. patent application entitled "Alignment Target with Designed in Offset" by Weidong Yang, Roger R. Lowe-Webb, and John D. Heaton, Ser. No. 10/116,863, which is incorporated herein in its entirety. Alternatively, multiple locations may be measured along the pattern.

The measured diffraction at the two locations is then compared, e.g., subtracted. Variations in the diffraction as a function of lateral position along the alignment target 400 are characteristic of the lateral offset error between the top diffraction grating 404 and the bottom diffraction grating 406.

It should be understood that there may be some separation between the bottom diffraction grating 402 and the top diffraction grating 404, particularly when the alignment target 400 is used in an alignment system, such as that described in reference to FIG. 15.

Figure 21:
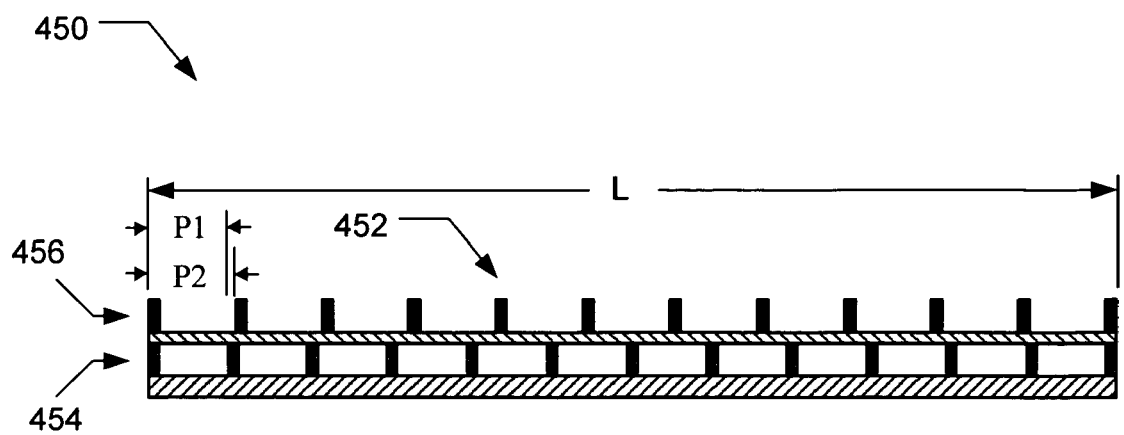
FIG. 21 is another alignment target, similar to alignment target of FIG. 20, in accordance with an embodiment of the present invention.
Figure 21:
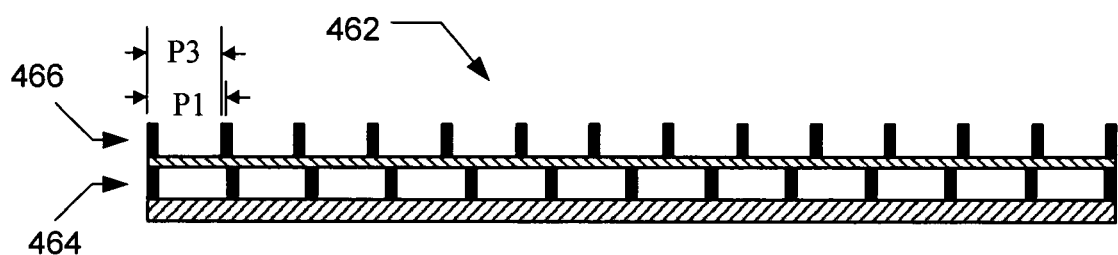

FIG. 21 is another alignment target 450, similar to alignment target 400 shown in FIG. 20, but that includes two overlay patterns 452 and 462, in accordance with an embodiment of the present invention. Overlay pattern 452 includes a bottom periodic pattern, e.g., diffraction grating 454, and a top periodic pattern, e.g., diffraction grating 456. The bottom diffraction grating 454 has a pitch P1. The top diffraction grating 456, similar to alignment target 400 in FIG. 20, has a pitch P2 that is equal to pitch P1 plus an additional term δ, which is a small fraction of pitch P1, i.e., P2=P1+δ. The linear dimension L perpendicular to the grating lines of alignment target 450 for overlay pattern 452 should be sufficient to ensure that all phases between 0 and 360 degrees are present.

Overlay pattern 462 includes a bottom diffraction grating 464 and a top diffraction grating 466. The bottom diffraction grating 464 also has a pitch P1. The top diffraction grating 466 has a pitch P3 that is equal to pitch P1 minus the additional term δ, i.e., P3=P1−δ. The linear dimension L perpendicular to the grating lines of alignment target 450 for overlay pattern 462 should be sufficient to ensure that all phases between 0 and 360 degrees.

Similar to alignment target 400, any appropriate metrology instrument, such as those described in FIGS. 12A–12C, may be used to measure the alignment target 400, but the diameter of the probe spot should have a lateral dimension that is sufficiently small that the variation in the lateral offset between the lines of the bottom diffraction gratings 454, 464 and the top diffraction gratings 456, 466 within the probe spot is small compared to pitch P1. The diffraction from the overlay pattern 452 and overlay pattern 454 is measured, either simultaneously or separately. The resulting measured diffraction as a function of lateral position of overlay pattern 452 and 462 is then compared, e.g., subtracted to provide the lateral offset error.

Figure 22:
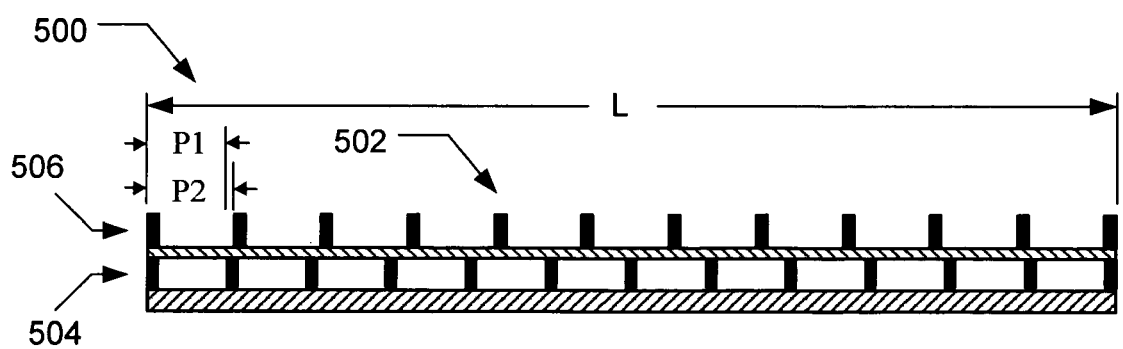
FIG. 22 is another alignment target, similar to alignment target of FIG. 21, in accordance with an embodiment of the present invention.
Figure 22:
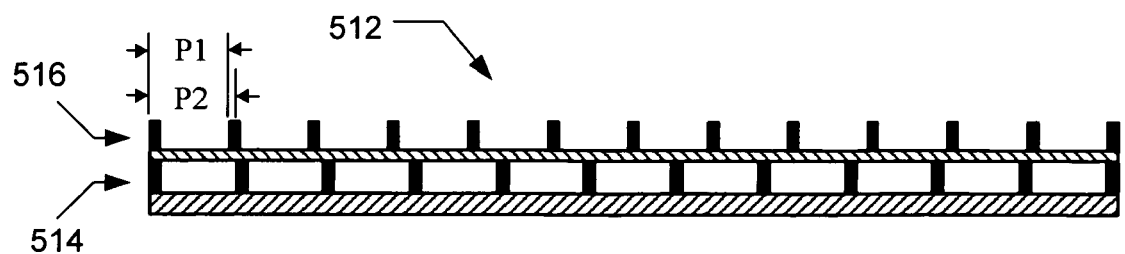

FIG. 22 is another alignment target 500, that includes overlay pattern 502 and overlay pattern 512, which is a mirror image of overlay pattern 502. Overlay pattern 502 includes a bottom diffraction grating 504 and a top diffraction grating 506. The bottom diffraction grating 504 has a pitch P1 and the top diffraction grating 506 has a pitch P2 that is equal to pitch P1 plus an additional term δ, which is a small fraction of pitch P1, i.e., P2=P1+δ. The linear dimension L perpendicular to the grating lines of alignment target 500 for overlay pattern 502 should be sufficient to ensure that all phases between 0 and 360 degrees. The second overlay pattern 512 of alignment target 500 includes a bottom diffraction grating 514 that has pitch P2 and a top diffraction grating 516 that has pitch P1. The measurement of the overlay error using alignment target 500 is similar to that described in reference to alignment target 450.

Figure 23:
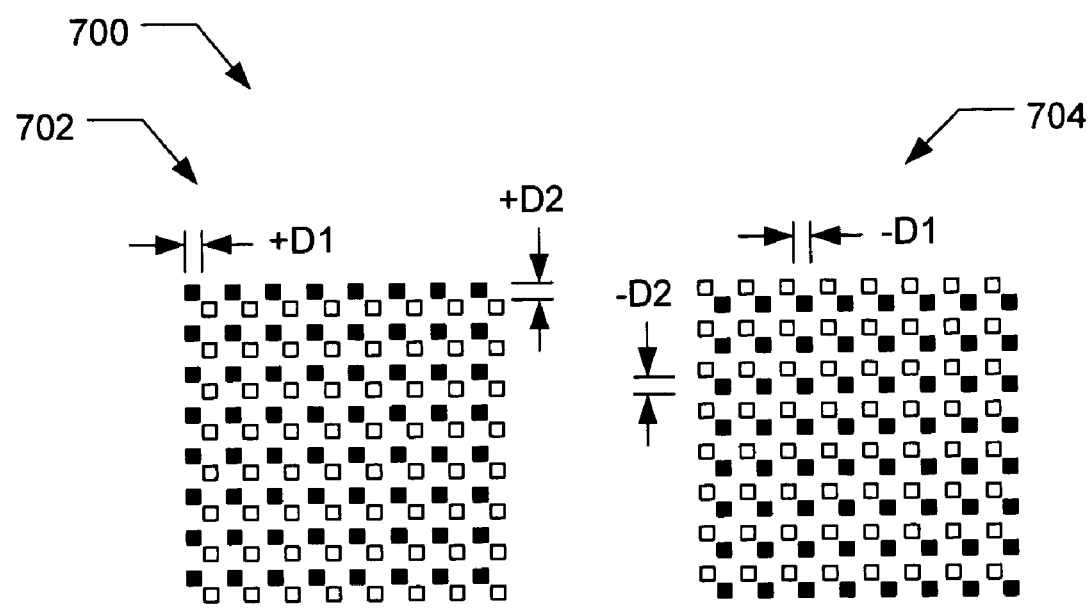
FIG. 23 shows a top view of an overlay pattern that is a bi-grating that may be used in accordance with the present invention.

In addition, it should be understood that two dimensional periodic patterns, referred to herein as bi-gratings, may be used with the present invention. FIG. 23 shows a top view of an alignment target 700 that is two bi-gratings 702, 704 that may be used in accordance with the present invention. Instead of a series of lines that extend in one direction, overlay pattern 700 includes a series of squares that extend in two directions. The solid squares in FIG. 23 are, e.g., the bottom diffraction bi-gratings, while the empty squares are the top diffraction bi-gratings. Overlay pattern 700, includes a designed in offset ±D1 in the X direction and a designed in offset ±D2 in the Y direction. The magnitude of offsets D1 and D2 may be the same or different. If desired, the bi-grating may be formed using other shapes besides squares, e.g., circles or polygons. If desired, bi-gratings may be used as the top periodic pattern, the bottom periodic pattern or both.

Figure 24A:
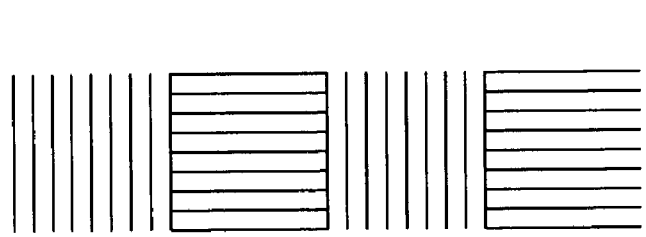
FIGS. 24A and 24B shows a top view of two exemplary arrangements of diffraction gratings in an alignment target of the present invention.
Figure 24B:
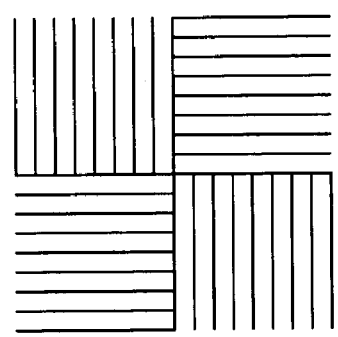

FIGS. 24A and 24B shows a top view of two exemplary arrangements of periodic patterns in an alignment target of the present invention. As can be seen in FIG. 24A, the periodic patterns for the X axis and the Y axis may all be linearly arranged. FIG. 24B shows the periodic patterns in a matrix arrangement. With the proper arrangements of circular apertures or slits, as described in reference to FIGS. 13A and 14A, all of the periodic patterns in FIGS. 24A and 24B may be simultaneously measured if desired.

In addition, it should be understood that the alignment target used in the present invention does not need to have a symmetrical designed in offset at the measurement locations. For example, the magnitude may vary and/or the direction of offset may be at an angle from one measurement location to the other.

Figure 25:
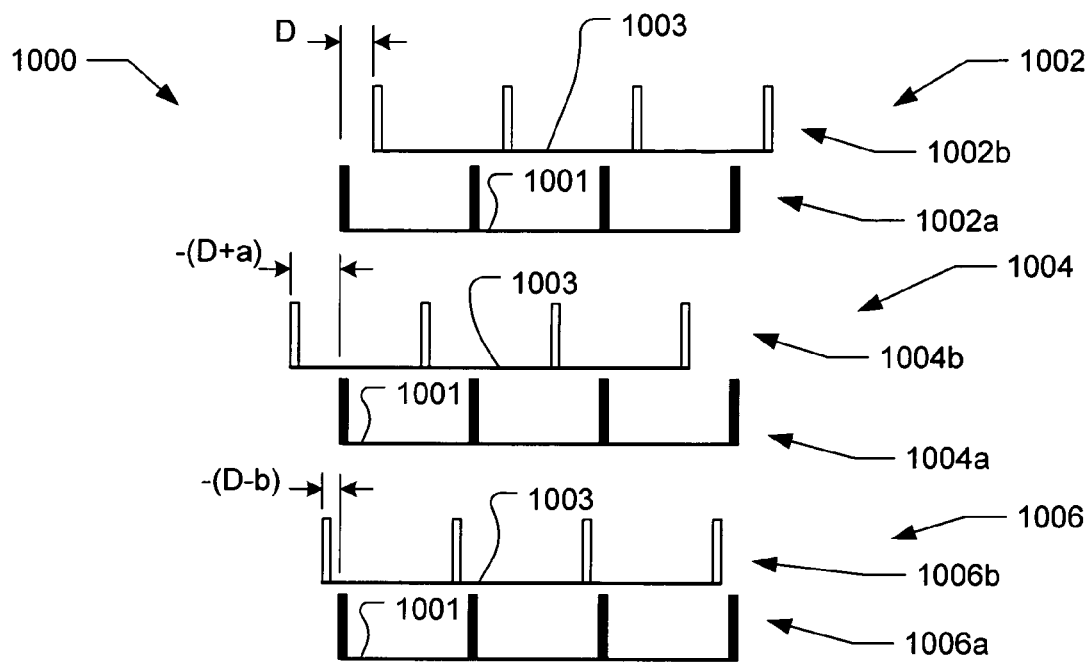
FIG. 25 shows another embodiment of an alignment target that has three measurement locations with designed in offsets of different magnitudes.

FIG. 25 shows another embodiment of an alignment target 1000 that has three measurement locations, referred to as overlay patterns 1002, 1004, and 1006. Each of the overlay patterns has a bottom periodic pattern on element 1001, e.g., diffraction gratings 1002a, 1004a, 1006a and a top periodic pattern on element 1003, e.g., diffraction gratings 1002b, 1004b, 1006b. Each of the measurement locations, i.e., overlay patterns 1002, 1004, 1006, on the alignment target 1000 have a designed in offset between the bottom periodic pattern and the top periodic pattern. However, as can be seen in FIG. 25, the designed in offsets at each location are not equal in magnitude. For example, overlay pattern 1002 has a designed in offset of +D, while overlay pattern 1004 has a designed in offset of −(D+a) and overlay pattern 1006 has a designed in offset of −(D−b), where a and b may or may not be the same. An alignment error in alignment target 1000 may then be determined by measuring each location, e.g., producing light that is incident on each location and detecting the light from each location after interacting with the location, and comparing the detected light from each location. The alignment error e in alignment target 1000 may be calculated as follows:

$$e = (a+b) * \frac{\left(R1 - \frac{(R2*b + R3*a)}{(a+b)}\right)}{(R2 - R3)} \quad \text{eq. 8}$$

where R1, R2, and R3 are the reflectances from overlay patterns 1002, 1004, and 1006, respectively.

Figure 26A:
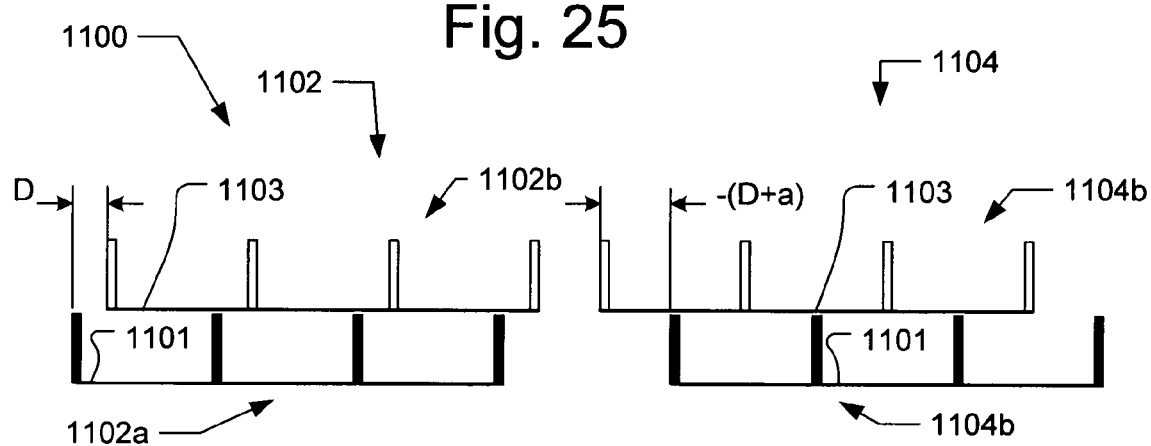
FIGS. 26A and 26B show another embodiment of an alignment target that has measurement locations with designed in offsets of different magnitudes.

FIG. 26A shows another embodiment of an alignment target 1100 that has measurement locations, referred to as overlay patterns 1102 and 1104. Again, each of the overlay patterns has a bottom periodic pattern on element 1101, e.g., diffraction gratings 1102a and 1104a and a top periodic pattern on element 1103, e.g., diffraction gratings 1102b and 1104b. Each of the measurement locations, i.e., overlay patterns 1102 and 1104, on the alignment target 1100 have a designed in offset between the bottom periodic pattern and the top periodic pattern. Overlay pattern 1102 has a designed in offset of +D while overlay pattern 1104 has a designed in offset of −(D+a), where a is a known amount. When the difference between the detected radiation, e.g., diffracted light, from the two overlay patterns 1102 and 1104, is at a minimum, the alignment error will be skewed by a/2. Alignment target 1100 is particularly useful in an alignment system, as once the difference between the detected radiation is minimized, the alignment system can simply move the two elements 1101 and 1103 a distance a/2 relative to each other to place the two elements in alignment. To determine the amount of the alignment error, a modeling process, or a reference measurement location, as described above, may be used.

Figure 26B:
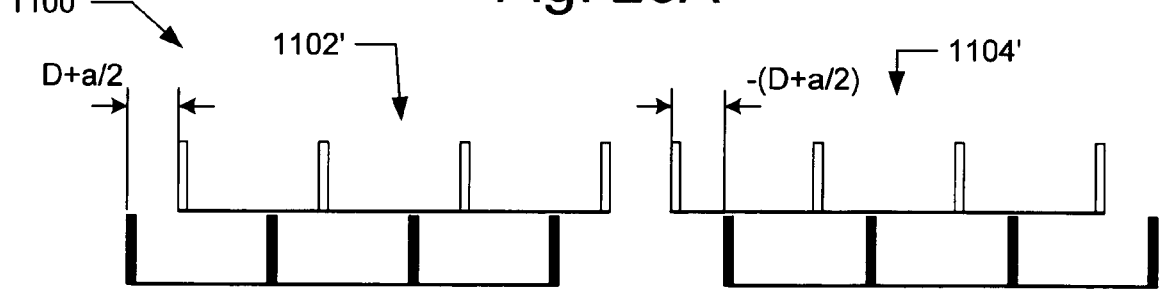

FIG. 26B shows alignment target 1100', which is equivalent to alignment target 1100 in FIG. 26A with a shift of a/2. Alignment target 1100' has symmetrical designed in offsets of +D+a/2 on overlay pattern 1102' and −(D+a/2) on overlay pattern 1104'. Thus, it can be seen that the asymmetric designed in offset is equivalent to the symmetric designed in offset. Consequently, any of the embodiments that may be used for symmetrical designed in offsets may also be used for asymmetrical designed in offsets, with an appropriate correction, e.g., a/2.

Thus, as can be seen, the magnitude of the designed in offset between the measurement locations on the alignment target need not be equal. In addition, if desired, the two measurement locations on the alignment target may include an arbitrary angle between the direction of the periodic patterns.

Figure 27A:
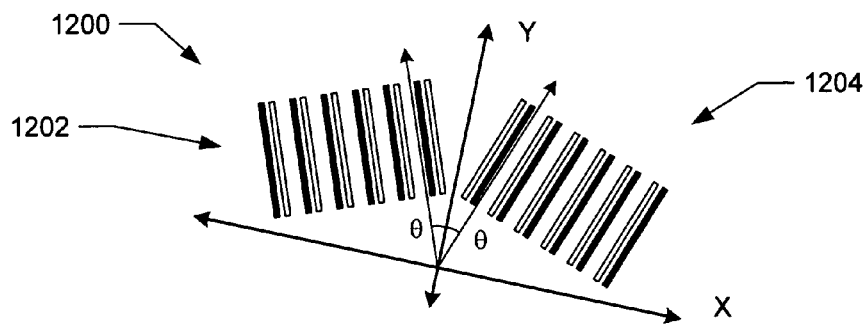
FIGS. 27A and 27B are top views showing an two alignment targets, which includes two measurement locations having designed in offsets in different directions.
Figure 27B:
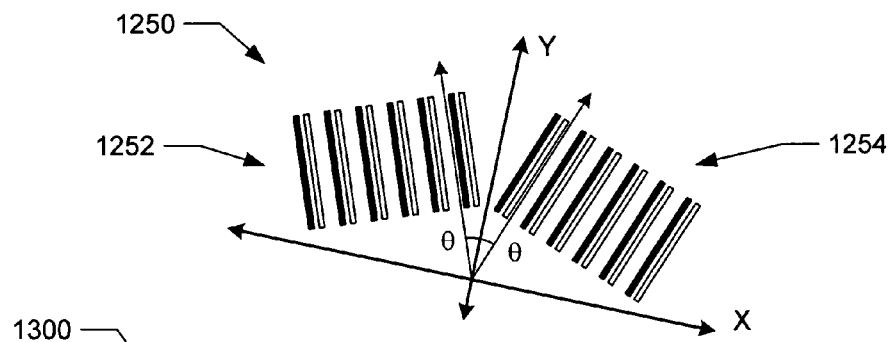

FIGS. 27A and 27B are top views showing alignment targets 1200 and 1250, which includes two measurement locations having designed in offsets. The two measurement locations are referred to as overlay patterns 1202, 1204 and 1252, 1254, where the bottom periodic patterns are shown as solid blocks and the top periodic patterns are shown as empty blocks. The X and Y axes are shown for reference in FIGS. 27A and 27B. As can be seen, the periodic patterns of overlay patterns 1202 and 1252 form an angle θ with the Y axis and periodic patterns of overlay patterns 1204 and 1254 form an angle −θ with the Y axis. Thus, overlay patterns 1202 and 1204 are arranged at an angle 2θ with respect to each other, as are overlay patterns 1252 and 1254. Consequently, the designed in offset at the two overlay patterns 1202 and 1204 in alignment target 1200 (and overlay patterns 1252 and 1254 in alignment target 1250) may have the same magnitude, e.g,. D, but it is not in opposite directions. The direction of the designed in offsets in the overlay patterns are at an arbitrary angle with respect to each other. It should be understood that the angles used in alignment targets 1200 and 1250 may differ if desired.

Alignment target 1200 in FIG. 27A is sensitive to alignment error along the X axis but not the Y axis because of the arrangement of the bottom periodic patterns (shown as solid blocks) and the top periodic patterns (shown as empty blocks). In other words, if an alignment error occurs along the Y direction, both overlay patterns 1202 and 1204 will change in the same manner, and thus, alignment target 1200 is insensitive to the error. If however, an alignment error occurs along the X direction, the overlay patterns 1202 and 1204 will vary by different amounts. Thus, alignment target 1200 is sensitive to alignment errors in the X direction.

Alignment target 1250 in FIG. 27B, on the other hand, is sensitive to alignment error along the Y axis but not the X axis because of the arrangement of the bottom periodic patterns (shown as solid blocks) and the top periodic patterns (shown as empty blocks). As can be seen in FIG. 27B, if an alignment error occurs along the X direction, both overlay patterns 1252 and 1254 will change in the same manner, but if an alignment error occurs along the Y direction, the overlay patterns 1252 and 1254 will vary by different amounts. Thus, alignment target 1250 is sensitive to alignment errors in the Y direction and insensitive to alignment errors in the X direction.

Figure 28:
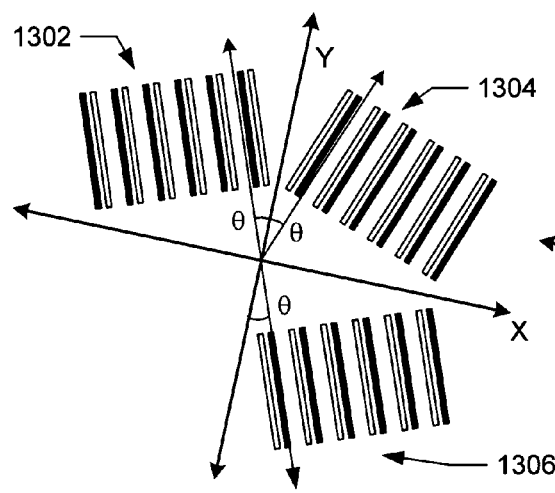
FIG. 28 is a top view showing an alignment target with three measurement locations, each at an angle with respect to one another.

FIG. 28 is a top view showing an alignment target 1300, which is similar to alignment targets 1200 and 1250 combined. Alignment target 1300 includes overlay patterns 1302, 1304, which are similar to overlay patterns 1202 and 1204. In addition, alignment target 1300 includes a third measurement location, referred to as overlay pattern 1306, where the bottom periodic patterns are shown as solid blocks and the top periodic patterns are shown as empty blocks. The periodic patterns of overlay pattern 1302 forms an angle $\theta$ with the Y axis and periodic patterns of overlay pattern 1304 forms an angle $-\theta$ with the Y axis. The periodic patterns of overlay pattern 1306 also forms an angle $\theta$ with the Y axis as shown in FIG. 28. As described above in reference to FIGS. 27A and 27B, overlay patterns 1302 and 1304 are sensitive to alignment error along the X axis, while overlay patterns 1304 and 1306 are sensitive to alignment error along the Y axis.

Figure 29:
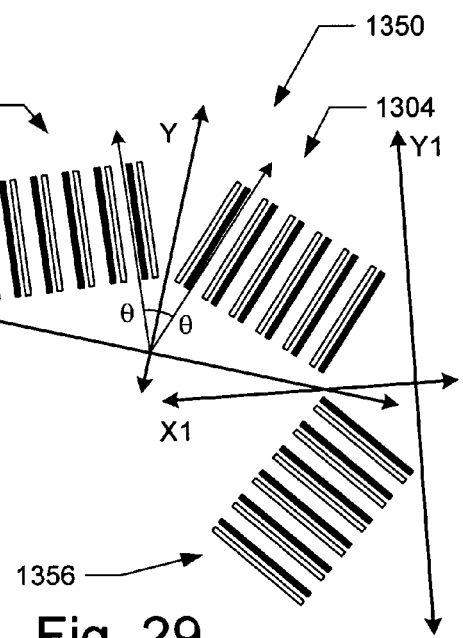
FIG. 29 shows an alignment target, similar to that shown in FIG. 28 but with a different coordinate systems.

FIG. 29 shows an alignment target 1350, similar to alignment target 1300, like designed elements being the same, except that overlay pattern 1304 and overlay pattern 1356 are sensitive in a direction along a different coordinate system. Thus, a coordinate system conversion must be performed to determine the alignment error in the Y direction.

Figure 30:
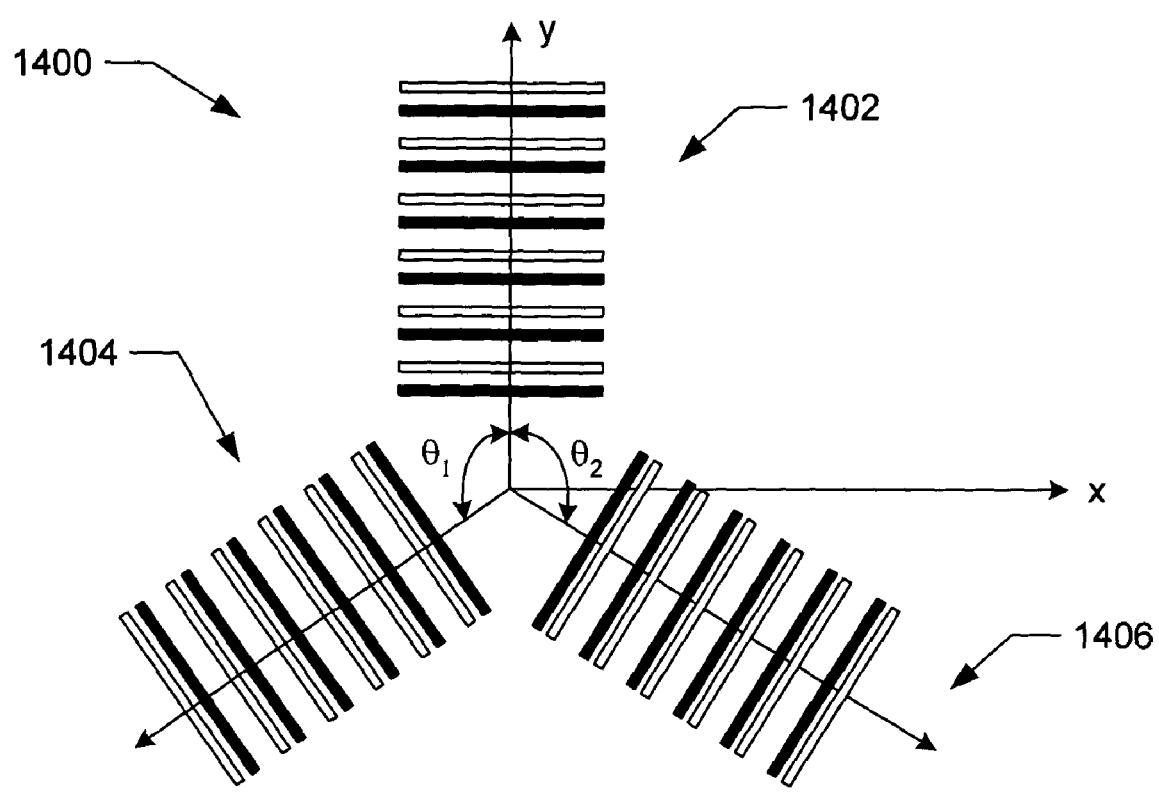
FIG. 30 is a top view showing an alignment target with three measurement locations, each at an angle with respect to one another.

FIG. 30 is a top view showing an alignment target 1400, which includes three measurement locations, referred to as overlay patterns 1402, 1404, and 1406, where the bottom periodic patterns are shown as solid blocks and the top periodic patterns are shown as empty blocks. As can be seen in FIG. 30, the overlay patterns 1402, 1404, and 1406 are at arbitrary angles with respect to one another. Moreover, the magnitude of the designed in offsets between the top periodic patterns and the bottom periodic patterns in the overlay patterns 1402, 1404, and 1406 may vary.

For example, designed in offsets of d1, d2, and d3 may be used for overlay patterns 1402, 1404, and 1406, respectively. Without losing generality, overlay pattern 1402 can be set along the y direction. Overlay pattern 1404 is separated from overlay pattern 1402 by an angle $\theta 1$, and overlay pattern 1406 is separated from overlay pattern 1404 by an angle $\theta 2$. Thus, with an alignment error of (x, y), the new offset for the three overlay patterns 1402, 1404, and 1406 are a1, a2, and a3, respectively. If a careful arrangement of incidence angles, azimuthal angles, and polarization states is used, spectra from the three overlay patterns will become identical when a1=a2=a3. This occurs when the following conditions are satisfied:

$$x = \frac{(d1-d2)\cos(\theta 2) - (d1-d3)\cos(\theta 1) + (d2-d3)}{(\sin(\theta 1) - \sin(\theta 2)) - \sin(\theta 1 - \theta 2)} \quad \text{eq. 9}$$

$$y = \frac{(d1-d2)\sin(\theta 2) - (d1-d3)\sin(\theta 1)}{(\sin(\theta 1) - \sin(\theta 2)) - \sin(\theta 1 - \theta 2)}.$$

A special case is $\theta 1=120°$, $\theta 2=-120°$, and the conditions are reduced to:

$$x = \frac{d2-d3}{\sqrt{3}} \quad \text{eq. 10}$$

$$y = \frac{d2+d3-2d1}{3}.$$

Another special case is $\theta 1=90°$, $\theta 2=-90°$, and the conditions are reduced to:

$$x = \frac{d2-d3}{2} \quad \text{eq. 11}$$

$$y = \frac{d2+d3-2d1}{2}.$$

Thus, it can be seen that designed in offsets in the overlay patterns can have various magnitudes and angles with respect to each other.

Although the invention has been described with reference to particular embodiments, the description is only an example of the invention's application and should not be taken as a limitation. Various other adaptations and combinations of features of the embodiments disclosed are within the scope of the invention as defined by the following claims.

What is claimed is:

1. A method of positioning a first element with respect to a second element, said method comprising:
   providing an alignment target on said first element and said second element, said alignment target having at least two locations having a periodic pattern on said first element and a periodic pattern on said second element that overlap and have the same pitch, at least one of said locations has a designed in offset between said periodic pattern on said first element and said periodic pattern on said second element such that when said first element and said second element are aligned said periodic pattern on said first element and said periodic pattern on said second element are offset;
   illuminating said at least two locations on said alignment target with incident radiation;
   detecting the radiation from said at least two locations after interacting with said alignment target;
   comparing the detected radiation from said at least two locations to determine the alignment of said first element with respect to said second element; and
   moving said first element with respect to said second element.

2. The method of claim 1, wherein said comparing the detected radiation includes calculating the difference between the detected radiation from a first location and the detected radiation from a second location.

3. The method of claim 1, wherein said first element is a reference mask and said second element is a substrate.

4. The method of claim 1, wherein said periodic patterns are diffraction gratings.

5. The method of claim 1, wherein at least one of said periodic patterns is a bi-grating having periodicity in two directions.

6. The method of claim 1, wherein detecting radiation comprises determining the spectra from said at least two locations of said alignment target and wherein said comparing the detected radiation comprises calculating the difference between said spectra.

7. The method of claim 1, wherein detecting the radiation from said at least two locations after reacting with said alignment target comprises:

receiving light diffracted by said at least two locations on a two dimensional array detector that receives said diffracted light with the spectra dispersed along one dimension of said detector and the spectra associated with different locations on said alignment target separated along the direction perpendicular to the direction of the spectral dispersion.

8. The method of claim 1, wherein said at least two locations is illuminated with radiation at the same time.

9. The method of claim 1, wherein moving said first element with respect to said second element is in response to the comparison of the detected radiation to align said first element with said second element.

10. The method of claim 1, wherein said at least two locations have designed in offsets of equal magnitude but in opposite directions.

11. The method of claim 1, wherein said at least two locations have designed in offsets of unequal magnitude.

12. The method of claim 1, wherein said two at least locations have designed in offsets in non-parallel directions.

13. A method comprising:

determining when a first element is aligned with a second element using at least two locations of an alignment target having a periodic pattern on said first element and a periodic pattern on said second element that overlap and have the same pitch, at least one of said two locations having a designed in offset between said periodic pattern on said first element and said periodic pattern on said second element so that when said first element is aligned with said second element there is a non-zero offset between said periodic pattern on said first element and said periodic pattern on said second element, wherein each of said at least two locations includes a periodic pattern on said first element and a periodic pattern on said second element, the periodic patterns of said at least two locations being oriented in the same direction; and moving said first element relative to said second element.

14. The method of claim 13, wherein determining when a first element is aligned with a second element comprises:

illuminating said at least two locations on said alignment target;

detecting the radiation from each location after interacting with said alignment target; and calculating the difference between the detected radiation from each location.

15. The method of claim 14, wherein determining when a first element is aligned with a second element further comprises determining if said difference is at a minimum.

16. The method of claim 13, wherein said at least two locations have designed in offsets of equal magnitude but in opposite directions.

17. The method of claim 13, wherein said at least two locations have designed in offsets of unequal magnitude.

18. The method of claim 13, wherein said at least two locations have designed in offsets in non-parallel directions.

19. The method of claim 14, further comprising:

calculating the difference between the detected radiation from each location for a plurality of positions between said first element and said second element;

recording the calculated difference for each of said plurality of positions;

using the recorded calculated difference as a reference to determine the amount of alignment error between said first element and said second element.

20. An apparatus for positioning a first element with respect to a second element, said apparatus comprising:

an alignment target having at least two locations with a periodic pattern on said first element and a periodic pattern on said second element that overlap and have the same pitch, at least one of said locations has a designed in offset between said periodic pattern on said first element and said periodic pattern on said second element so that when said first element is aligned with said second element there is a non-zero offset between said periodic pattern on said first element and said periodic pattern on said second element, wherein said alignment target includes at least two locations, each location including a diffraction grating on said first element and a diffraction grating on said second element, the diffraction gratings of said at least two locations being oriented in the same direction;

at least one light source for producing light to be incident on said at least two locations of said alignment target;

at least one light detector for detecting light that interacts with said two locations of said alignment target;

a processor coupled to said light detector, said processor receiving an output signal from said at least one light detector, said processor having a computer-usable medium having computer-readable program code embodied therein for causing said processor to calculate the difference between the detected light from said two locations; and a stage coupled to said processor, said stage moves one of said first element and said second element with respect to each other, said stage being controlled by said processor.

21. The apparatus of claim 20, wherein said apparatus is an exposure tool having a lens and a substrate stage for holding said first element, said first element is a substrate, said second element is a reference mask physically coupled to said lens.

22. The apparatus of claim 20, wherein said light detector measures the spectra from each location, and wherein said computer-readable program code embodied in said computer-usable medium causes said processor to calculate the difference between said spectra.

23. The apparatus of claim 22, wherein said processor controls said stage to move until said difference between spectra converges on approximately zero.

24. An apparatus for positioning a first element with respect to a second element, said apparatus comprising:

an alignment target having at least one periodic pattern on said first element and at least one periodic pattern on said second element, said alignment target including at least two locations, at least one of which has a designed in offset between said periodic pattern on said first element and said periodic pattern on said second element;

at least one light source for producing light to be incident on said at least two locations of said alignment target;

at least one light detector for detecting light that interacts with said two locations of said alignment target;

a processor coupled to said light detector, said processor receiving an output signal from said at least one light detector, said processor having a computer-usable medium having computer-readable program code embodied therein for causing said processor to calculate the difference between the detected light from said two locations; and a stage coupled to said processor, said stage moves one of said first element and said second element with respect to each other, said stage being controlled by said processor;

wherein said light source produces light that is simultaneously incident on said at least two locations of said alignment target; said apparatus further comprising:

an imaging spectrometer grating that receives diffracted light from said at least two locations and focuses said diffracted light on said light detector;

wherein said light detector is a two dimensional array detector that receives said diffracted light with the spectra dispersed along one dimension of said detector and the spectra associated with different locations on said alignment target separated along the direction perpendicular to the direction of the spectral dispersion.

25. A method of positioning a first element with respect to a second element, said method comprising:

providing an alignment target on said first element and said second element, said alignment target having at least two locations having a periodic pattern on said first element and a periodic pattern on said second element that overlap and have the same pitch, at least one of said two locations having a designed in offset between said periodic pattern on said first element and said periodic pattern on said second element, so that when said first element is aligned with said second element there is a non-zero offset between said periodic pattern on said first element and said periodic pattern on said second element, wherein each of said at least two locations includes a periodic pattern on said first element and a periodic pattern on said second element, the periodic patterns of said at least two locations being oriented in the same direction;

illuminating said alignment target with incident radiation when said first element and said second element are in a first position;

detecting the radiation from at least two locations after interacting with said alignment target;

moving said first element with respect to said second element by a known distance into a second position;

illuminating said alignment target with incident radiation when said first element and said second element are in said second position;

detecting the radiation from said at least two locations after interacting with said alignment target; and comparing the detected radiation from said first position and said second position to determine the alignment of said first element with respect to said second element.

* * * * *